United States Patent
Guo et al.

(10) Patent No.: US 12,302,646 B2
(45) Date of Patent: May 13, 2025

(54) PHOTOVOLTAIC MODULE AND PREPARATION METHOD THEREOF

(71) Applicants: ZHEJIANG JINKO SOLAR CO., LTD., Zhejiang (CN); JINKO SOLAR CO., LTD., Jiangxi (CN)

(72) Inventors: Zhiqiu Guo, Zhejiang (CN); Ningbo Zhang, Zhejiang (CN); Guohui Hao, Zhejiang (CN); Shiliang Huang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/309,707

(22) Filed: Apr. 28, 2023

(65) Prior Publication Data

US 2024/0243211 A1  Jul. 18, 2024

(30) Foreign Application Priority Data

Jan. 16, 2023  (CN) .......................... 202310089709.2
Jan. 16, 2023  (CN) .......................... 202310089760.3

(51) Int. Cl.
*H10F 19/80* (2025.01)
*H10F 19/90* (2025.01)
(Continued)

(52) U.S. Cl.
CPC ......... *H10F 19/807* (2025.01); *H10F 19/904* (2025.01); *H10F 71/137* (2025.01); *H10F 77/68* (2025.01)

(58) Field of Classification Search
CPC ............... H01L 31/048; H01L 31/0488; H01L 31/0508; H01L 31/0512; H01L 31/0521;
(Continued)

(56) References Cited

U.S. PATENT DOCUMENTS 9,484,479 B2 * 11/2016 Hamaguchi ......... H01L 31/0512
9,490,382 B2 * 11/2016 Hashimoto ......... H01L 31/0508
(Continued)

FOREIGN PATENT DOCUMENTS

CN      105702794 A    6/2016
CN      105702796 A    6/2016
(Continued)

OTHER PUBLICATIONS

Zhejiang Jinko Solar Co., Ltd., et al., Extended European Search Report, EP 23170534.4, Sep. 18, 2023, 9 pgs.
(Continued)

*Primary Examiner* — Golam Mowla
(74) *Attorney, Agent, or Firm* — USCH Law, PC

(57) ABSTRACT

A photovoltaic module includes a plurality of cells, each of the plurality of cells including grid structures spaced apart in a first direction; a plurality of connection components extending along the first direction and spaced apart in a second direction, each of the plurality of connection components being electrically connected to corresponding adjacent cells; a plurality of composite films, each of the plurality of composite films covering a surface of a respective connection component and portions of a surface of a corresponding cell on opposite sides of the respective connection component; an encapsulation layer, covering surfaces of the plurality of composite films; a cover plate, disposed on a side of the encapsulation layer away from the plurality of cells. Each of the plurality of composite films includes a first layer and a second layer, and the first layer is located between the second layer and the respective connection component.

19 Claims, 6 Drawing Sheets

(51) Int. Cl.
  *H10F 71/00* (2025.01)
  *H10F 77/63* (2025.01)
(58) Field of Classification Search
  CPC ...... H10F 19/137; H10F 19/807; H10F 77/68; H10F 19/904
  See application file for complete search history.

(56) References Cited

U.S. PATENT DOCUMENTS

| | | | |
|---|---|---|---|
| 10,872,992 B2 | 12/2020 | Gragert et al. | |
| 2004/0035458 A1* | 2/2004 | Beernink | H10F 19/904 136/244 |
| 2007/0235077 A1* | 10/2007 | Nagata | B32B 17/10788 136/256 |
| 2008/0121266 A1* | 5/2008 | Tsunomura | H01L 31/0516 136/244 |
| 2009/0032081 A1* | 2/2009 | Saita | H01L 31/0508 156/60 |
| 2009/0194148 A1* | 8/2009 | Taguchi | H01L 31/0543 136/251 |
| 2019/0207045 A1* | 7/2019 | Nakamura | H10F 19/20 |
| 2020/0212233 A1 | 7/2020 | Hashimoto et al. | |
| 2021/0066523 A1* | 3/2021 | Nakamura | H10F 19/85 |

FOREIGN PATENT DOCUMENTS

| | | |
|---|---|---|
| CN | 107833934 A | 3/2018 |
| CN | 108419433 A | 8/2018 |
| CN | 110943140 A | 3/2020 |
| CN | 111081802 A | 4/2020 |
| CN | 111509069 A | 8/2020 |
| CN | 111628028 A | 9/2020 |
| CN | 212257422 U | 12/2020 |
| CN | 112289879 A | 1/2021 |
| CN | 213071154 U | 4/2021 |
| CN | 113035986 A | 6/2021 |
| CN | 214411224 U | 10/2021 |
| CN | 113698877 A | 11/2021 |
| CN | 214753801 U | 11/2021 |
| CN | 215418200 U | 1/2022 |
| CN | 114032040 A | 2/2022 |
| CN | 114068733 A | 2/2022 |
| CN | 114068734 A | 2/2022 |
| CN | 114078980 A | 2/2022 |
| CN | 114093969 A | 2/2022 |
| CN | 114203836 A | 2/2022 |
| CN | 114447157 A | 5/2022 |
| CN | 114806421 A | 7/2022 |
| CN | 114975660 A | 8/2022 |
| CN | 217334107 U | 8/2022 |
| CN | 115050850 A | 9/2022 |
| CN | 115241311 A | 10/2022 |
| CN | 217691187 U | 10/2022 |
| CN | 115260922 A | 11/2022 |
| CN | 115295650 A | 11/2022 |
| CN | 115295653 A | 11/2022 |
| CN | 115117206 B | 12/2022 |
| CN | 217983361 U | 12/2022 |
| CN | 115732580 A | 3/2023 |
| CN | 115763602 A | 3/2023 |
| CN | 115763603 A | 3/2023 |
| JP | 2005057048 A | 3/2005 |
| JP | 2009248499 A | 10/2009 |
| JP | 2011074261 A | 4/2011 |
| JP | 2011074262 A | 4/2011 |
| JP | 2011077301 A | 4/2011 |
| JP | 2014058056 A | 4/2014 |
| JP | 2015185731 A | 10/2015 |
| JP | 2017537469 A | 12/2017 |
| JP | 2018082178 A | 5/2018 |
| JP | 2018515935 A | 6/2018 |
| JP | 2018113280 A | 7/2018 |
| JP | 2020088133 A | 6/2020 |
| JP | 2020107758 A | 7/2020 |
| JP | 2020531656 A | 11/2020 |
| KR | 1020170017576 A | 2/2017 |
| WO | 2014033829 A1 | 3/2014 |
| WO | 2014136204 A1 | 9/2014 |
| WO | 2014155418 A1 | 10/2014 |
| WO | 2015139516 A1 | 9/2015 |
| WO | 2016198797 A1 | 12/2016 |
| WO | 2017010385 A1 | 1/2017 |
| WO | 2021070743 A1 | 4/2021 |
| WO | 2022222628 A1 | 10/2022 |
| WO | 2023103260 A1 | 6/2023 |

OTHER PUBLICATIONS

Jianbin Qin et al., "Experiments in Polymer Physics", Northwestern Polytechnical University Press, Aug. 2021, p. 55, 4 pgs.
Zhejiang Jinko Solar Co., Ltd., et al., KR First Office Action with English translation, KR 10-2023-0093426, Jul. 16, 2024, 16 pgs.
Zhejiang Jinko Solar Co., Ltd., et al., Examination report No. 1 for standard patent application, AU 2023202640, Feb. 22, 2024, 11 pgs.
Zhejiang Jinko Solar Co., Ltd., et al., JP Decision to gant a patent, JP 2023092812, Feb. 21, 2024, 5 pgs.
Zhejiang Jinko Solar Co., Ltd., et al., Examination report No. 1 for standard patent application, AU 2023202896, Feb. 14, 2024, 5 pgs.
Zhejiang Jinko Solar Co., Ltd., et al., CN Notification of grant of patent right for invention, CN 2023101118635, Mar. 22, 2024, 6 pgs.
Zhejiang Jinko Solar Co., Ltd., et al., CN First Office Action with English translation, CN 202310089709.2, Dec. 4, 2023, 11 pgs.
Zhejiang Jinko Solar Co., Ltd., et al., Partial European Search Report, EP 23172558.1, Oct. 26, 2023, 14 pgs.
Zhejiang Jinko Solar Co., Ltd., et al., CN First Office Action with English translation, CN 202310116607.5, Dec. 4, 2023, 12 pgs.
Zhejiang Jinko Solar Co., Ltd., et al., CN First Office Action with English translation, CN 202310111863.5, Dec. 29, 2023, 12 pgs.
Zhejiang Jinko Solar Co., Ltd et al., JP First Office Action with English translation, JP 2024-002201, Dec. 26, 2024, 14 pgs.

* cited by examiner

PHOTOVOLTAIC MODULE AND PREPARATION METHOD THEREOF

CROSS REFERENCE TO RELATED APPLICATIONS

This application claims priority to Chinese Patent Application No. CN202310089760.3, entitled "PHOTOVOLTAIC MODULE AND PREPARATION METHOD THEREOF," filed on Jan. 16, 2023, and to Chinese Patent Application No. CN202310089709.2, entitled "PHOTOVOLTAIC MODULE AND PREPARATION METHOD THEREOF," filed on Jan. 16, 2023, each of which is incorporated herein by reference in its entirety.

TECHNICAL FIELD

The various embodiments described in this document relate in general to photovoltaic field, and more specifically to a photovoltaic module and a preparation method thereof.

BACKGROUND

Solar cells are apparatuses for directly converting light energy into electric energy based on photoelectric effect or photochemical effect. A single solar cell cannot be used directly to generate power. In order to generate power, it is necessary to connect a plurality of single cells in series or in parallel by using ribbons and encapsulate them into a module closely. A solar cell module (also called solar cell panel) is a core part of a solar power generation system as well as the most important part in the solar power generation system. The function of the solar cell module is to convert solar energy into electric energy which is then supplied to an accumulator for storage or push load work.

Cells are very fragile and thus it is required to dispose adhesive films and cover plates on upper and lower surfaces of the cell module to protect the cells. The cover plate is usually a photovoltaic glass which cannot be directly attached to the cells but with the adhesive film to play bonding effect between the cells and the cover plate. Usually, welding ribbons for collecting a current are used to connect the cells. Conventionally, when the welding ribbons are welded, it is required to achieve alloying between the welding ribbon and a finger electrode by welding. Usually, light blocking and conduction between main bus bar and finger electrodes are balanced to improve cell efficiency and cell yield. There are still many factors which affect the yield of the photovoltaic modules.

Furthermore, a solder in the welding ribbon usually has a high melting point. In practical welding process, the welding temperature is more than 20° C. higher than the melting point of the solder. Due to large warping and deformation during welding process, the cells face a high risk of hidden cracks and high breakage rate after welding. Especially for a Passivated Emitter and Rear Cell (hereinafter "PERC cell"), due to having a large internal stress, it is more easily warped or deformed or broken after welding, resulting in increased assembly reworking rate and low finished product rate. Under the above background, in order to improve the welding quality, low-temperature welding ribbon and main bus bar free technology appear. But, there are still many factors affecting the yield of the modules, for example, the welding effect and welding yield of the welding ribbon and the finger electrode and the like.

SUMMARY

Embodiments of the present disclosure provide a photovoltaic module and a preparation method thereof, which at least helps increase the yield of the photovoltaic modules.

In some embodiments, a photovoltaic module includes a plurality of cells, each of the plurality of cells including grid structures spaced apart in a first direction. The photovoltaic module includes a plurality of connection components extending along the first direction and spaced apart in a second direction. Each of the plurality of connection components is electrically connected to corresponding adjacent cells. The photovoltaic module includes a plurality of composite films, each of the plurality of composite films covering a surface of a respective connection component of the plurality of connection components and portions of a surface of a corresponding cell on opposite sides of the respective connection component. Each of the plurality of composite films includes a first layer and a second layer, and the first layer is located between the second layer and the respective connection component. The photovoltaic module includes an encapsulation layer, covering surfaces of the plurality of composite films. The photovoltaic module includes a cover plate, disposed on a side of the encapsulation layer away from the plurality of cells.

In some embodiments, the first layer is an adhesive layer, the second layer is a blocking layer, and at least one of the adhesive layer and the blocking layer has a glass transition temperature greater than a glass transition temperature of the encapsulation layer.

In some embodiments, a first spacing between adjacent composite films is less than ⅚ of a second spacing between adjacent connection components. The first spacing refers to a distance between edges facing each other of the adjacent composite films. The second spacing refers to a distance between edges of the adjacent connection components.

In some embodiments, a ratio of a thickness of the adhesive layer to a thickness of the blocking layer is in a range of 1:5 to 75:1.

In some embodiments, the blocking layer surrounds a part of the adhesive layer.

In some embodiments, along the second direction, adjacent composite films are a continuous film layer.

In some embodiments, under a same preset temperature, the adhesive layer has a viscosity greater than a viscosity of the blocking layer.

In some embodiments, the blocking layer is different in material from the adhesive layer, and the blocking layer has material of a water transmission rate in a range of 2 to 4 g/m².

In some embodiments, the material of the blocking layer includes PET, POE, liquid silica gel or PVB.

In some embodiments, the photovoltaic module further includes adhesive points located on the surfaces of the plurality of cells. Each of the adhesive points is located between adjacent grid structures and the plurality of connection components are located on the adhesive points.

In some embodiments, the glass transition temperature of the adhesive layer is in a range of −55 to 0° C.

In some embodiments, the glass transition temperature of the blocking layer is in a range of 100 to 200° C.

In some embodiments, each of the plurality of composite films includes a first portion and a second portion, the first portion covering the surface of the respective connection component, and the second portion, surfaces corresponding to the second portion of the respective connection component and the corresponding cell enclosing a bonding gap.

Each of the plurality of composite films is provided with a plurality of air vents at a position corresponding to the bonding gap, and an orthographic projection of the plurality of air vents on the surface of the corresponding cell is not overlapped with an orthographic projection of the respective connection component on the surface of the corresponding cell.

In some embodiments, the first layer is provided with a first hole at a position corresponding to the bonding gap, and the second layer is provided with a second hole at a position corresponding to the bonding gap. The first hole and the second hole are jointly formed into a respective air vent of the plurality of air vents, and a size of the first hole is less than a size of the second hole.

In some embodiments, a respective air vent of the plurality of air vents has a first area on a first surface of a fixing film on which the respective air vent is located away from the corresponding cell, and a second area on a second surface of the fixing film close to the corresponding cell, and a ratio of the first area to the second area is in a range of 2:1 to 20:1.

In some embodiments, the second area is in a range of 3 $\mu m^2$ to 700 $\mu m^2$.

In some embodiments, a distance of adjacent air vents along the first direction of the plurality of air vents is in a range of 1 mm to 10 mm.

In some embodiments, a preparation method of a photovoltaic module includes providing a plurality of cells, each including grid structures spaced apart in a first direction. The method includes providing a plurality of connection components spaced apart in a second direction, where the plurality of connection components are located on surfaces of the plurality of cells and each of the plurality of connection components is electrically connected to adjacent cells of the plurality of cells respectively. The method includes providing a plurality of composite films, each covering a surface of a respective connection component of the plurality of connection components and a partial surface of a corresponding cell on which the respective connection component is located, where the partial surface is located at both sides of the respective connection component in a direction perpendicular to the first direction. Each of the plurality of composite films includes a first layer and a second layer, and the first layer is located between the second layer and the respective connection component. The method includes providing an encapsulation layer, covering surfaces of the plurality of composite films. The method includes providing a cover plate, located at a side of the encapsulation layer away from the plurality of cells. The method includes performing lamination processing.

In some embodiments, the first layer is an adhesive layer, the second layer is a blocking layer, and at least one of the adhesive layer and the blocking layer has a glass transition temperature greater than a glass transition temperature of the encapsulation layer. The plurality of composite films are prepared by: uniformly mixing raw materials of the adhesive layer according to a ratio, and extruding the mixture into a first raw material by an extrusion equipment; uniformly mixing raw materials of the blocking layer according to a ratio and extruding the mixture into a second raw material by the extrusion equipment; pouring one of the first raw material and the second raw material into a molding equipment based on a ratio to form an initial thin film; and performing co-extrusion and lamination to pour the other of the first raw material and the second raw material into the molding equipment and form the plurality of composite films by screw extrusion and lamination.

In some embodiments, after the plurality of composite films are provided, each of the plurality of composite films includes a first portion and a second portion, the first portion covering the surface of the respective connection component, and the second portion, surfaces corresponding to the second portion on the respective connection component and the corresponding cell enclosing a bonding gap. The method further includes after the plurality of composite films are provided, prior to the encapsulation layer is provided, forming a plurality of air vents on each of the plurality of composite films at a position corresponding to the bonding gap, where an orthographic projection of the plurality of air vents on the surface of the corresponding cell is not overlapped with an orthographic projection of the respective connection component on the surface of the corresponding cell.

BRIEF DESCRIPTION OF THE DRAWINGS

The present embodiments are illustrated by way of example and not limitation in the figures of the accompanying drawings, in which like references may indicate similar elements.

DETAILED DESCRIPTION OF THE EMBODIMENTS

Figure 1:
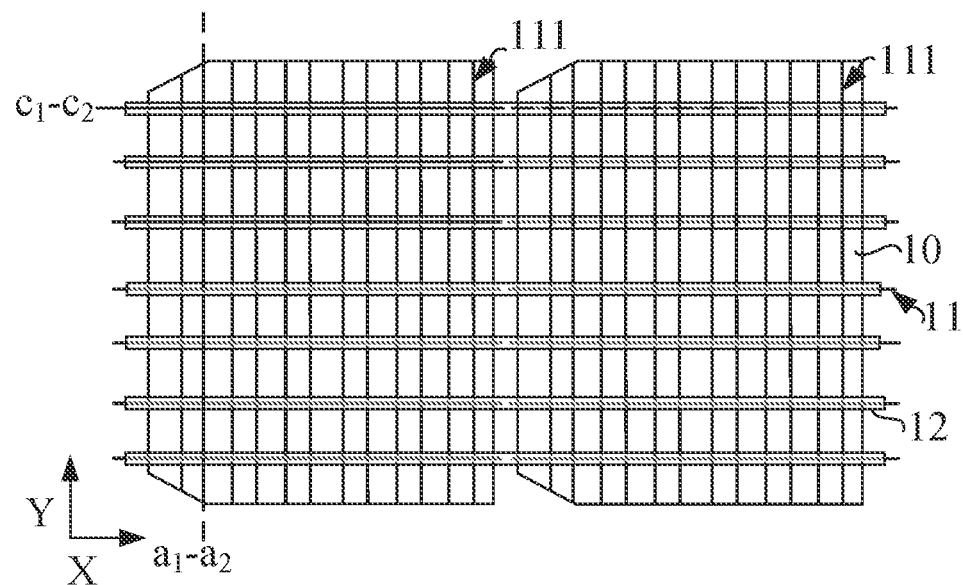
FIG. 1 is a schematic diagram illustrating a first structure of a photovoltaic module in accordance with some embodiments.

From the background, it can be known that the existing photovoltaic modules have a poor yield.

Analysis shows that one of the reasons for the poor yield of the existing photovoltaic modules is that: when the sunshine enters the cells from the front side of the cells, since the metal electrodes on the front side may block part of silicon slices, the light energy irradiated on the electrodes cannot be converted to electric energy. From this perspective, the grid lines are desired to be made as fine as possible. The grid lines are configured to conduct electric current. It is analyzed from the viewpoint of resistivity that, the finer the grid lines are, the smaller the conductive sectional area is, and the larger the resistance loss is. Therefore, the core of designing the main bus bar and the finger electrode (i.e. secondary grid) is to achieve balance between the light blocking and electric conductivity, and subsequently the welding ribbon in electric contact with the grids also needs to achieve balance between the light blocking and the electric conductivity. Furthermore, the alloying achieved between the welding ribbon and the grids conventionally is usually achieved by radiating heat toward the cells from the top of the welding ribbon at the temperature of 20° C. higher than the temperature of the welding ribbon. In this case, the high melting temperature of the welding ribbon requires a higher reflow temperature during the welding period, such that the cells may easily thermally warp. The thermal warping of the cells may harm the integrity of the formed welding spot, hence affecting its performance. Further, the thermal warping of the cells may also result in multiple soldering tin defects, for example, cell breakage, head in pillow effect, pseudo soldering, and the like.

Furthermore, the connection components use a metal with a low melting point as a solder and alloying between the grid structures and the connection components is achieved by lamination processing. For example, in a module lamination process, the pressure and the temperature of the laminator help to combine the low-melting-point metal and the grid structures. But, since the melting point of the adhesive film is lower than the melting point of the solder in the welding ribbon, when welding between the low-melting-point metal and the grid structures is performed, the welding ribbon may usually offset due to the push of the adhesive film in a molten state or the adhesive film overflows to the part between the welding ribbon and the finger electrode, resulting in cell breakage, pseudo soldering or the like, and further affecting the cell performance and bringing poor contact effect between the grid structures and the connection components.

An embodiment of the present disclosure provides a photovoltaic module. One composite film is disposed between the connection components and the encapsulation layer, and covers the surface of the connection components, where the composite films include the adhesive layer and the blocking layer, and the adhesive layer is configured to fix a relative position between the connection components and the cells, so as to prevent the offset of the connection components caused by the encapsulation layer in a molten state pushing the connection components; the blocking layer is configured to prevent the encapsulation layer in a molten state from flowing to a part between the connection components and the cells when lamination is performed, so as to avoid electric connection problem of the cells and the connection components. Further, the module weldability can be improved, the pull force in the extending direction of the welding ribbon can be increased, the welding quality of the modules can be improved, the pseudo soldering of the modules can be reduced, the product quality of the modules can be improved, and the reworking rate of the module process can be lowered and the like, so as to greatly improve the production of the modules. On the other hand, the glass transition temperature of at least one of the adhesive layer and the blocking layer is greater than the glass transition temperature of the encapsulation layer; during lamination process, the encapsulation layer is in a molten state, but one of the adhesive layer and the blocking layer is presented as close solid state. Thus, the adhesive film in a molten state is prevented from flowing to the part between the grid structures and the connection components. Furthermore, the adhesive layer and the blocking layer may serve as a part of the encapsulation layer to, on one hand, prevent the risk of the connection components penetrating through the encapsulation layer because of relatively small thickness of the adhesive film on the surface of the connection components. The composite films can also isolate moisture to improve the performance of the grid structures.

Detailed descriptions will be made below to the embodiments of the present disclosure in combination with accompanying drawings. However, persons of ordinary skill in the art may understand, in the embodiments of the present disclosure, many technical details are proposed to help readers to better understand the present disclosure. Without these technical details and various changes and modifications based on the following embodiments, the technical solutions claimed by the present disclosure can still be implemented.

Figure 2:
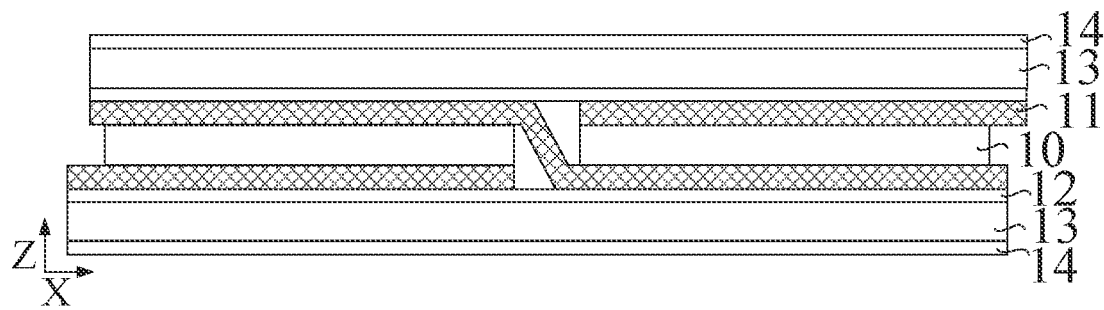
FIG. 2 is a schematic diagram illustrating a sectional structure of the section taken along $c_1$-$c_2$ in FIG. 1.
Figure 3:
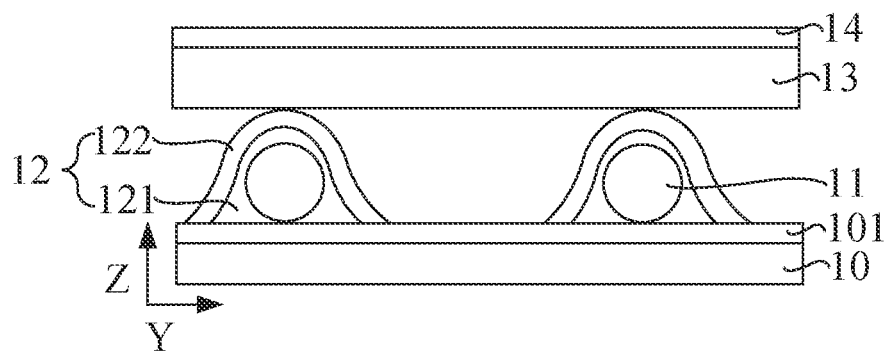
FIG. 3 is a schematic diagram illustrating a first sectional structure of the section taken along $a_1$-$a_2$ in FIG. 1.
Figure 4:
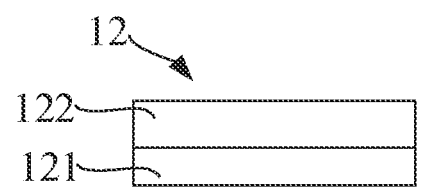
FIG. 4 is a schematic diagram illustrating a first structure of a composite film in a photovoltaic module according to an embodiment of the present disclosure.
Figure 5:
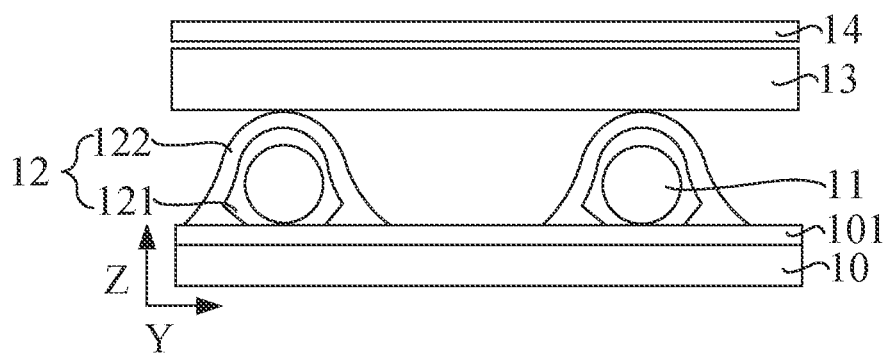
FIG. 5 is a schematic diagram illustrating a second sectional structure of the section taken along $a_1$-$a_2$ in FIG. 1.
Figure 6:
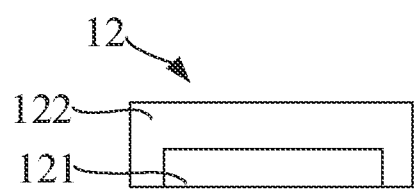
FIG. 6 is a schematic diagram illustrating a second structure of a composite film in a photovoltaic module according to an embodiment of the present disclosure.
Figure 7:
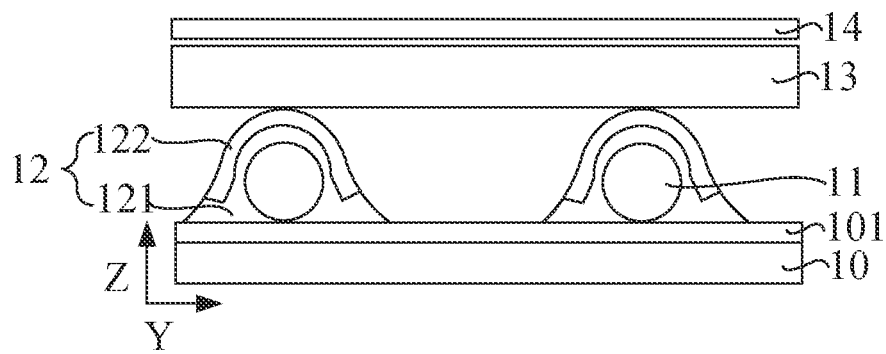
FIG. 7 is a schematic diagram illustrating a third sectional structure of the section taken along $a_1$-$a_2$ in FIG. 1.
Figure 8:
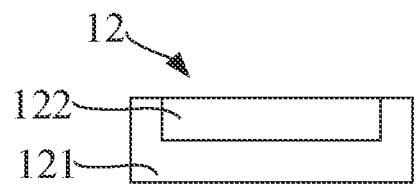
FIG. 8 is a schematic diagram illustrating a third structure of a composite film in a photovoltaic module according to an embodiment of the present disclosure.
Figure 9:
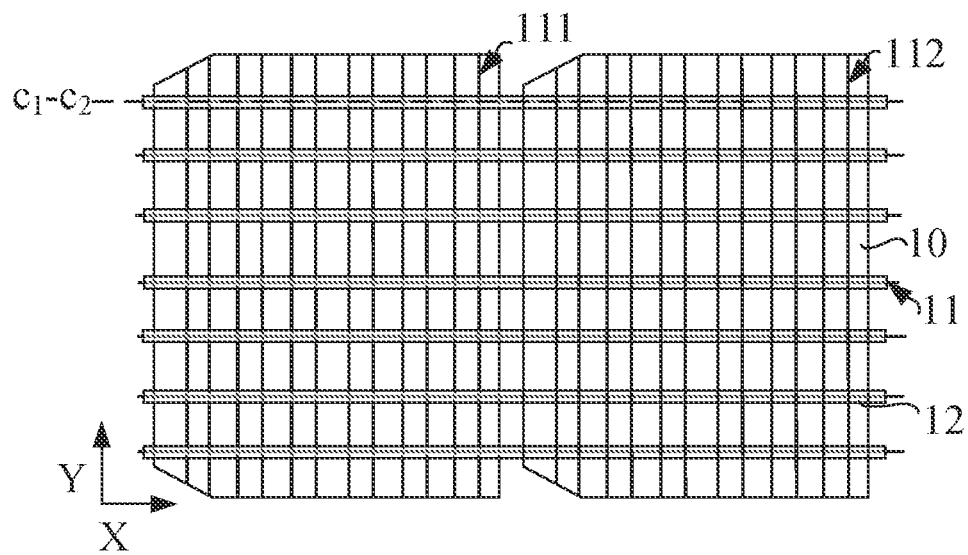
FIG. 9 is a schematic diagram illustrating a second structure of a photovoltaic module according to an embodiment of the present disclosure.
Figure 10:
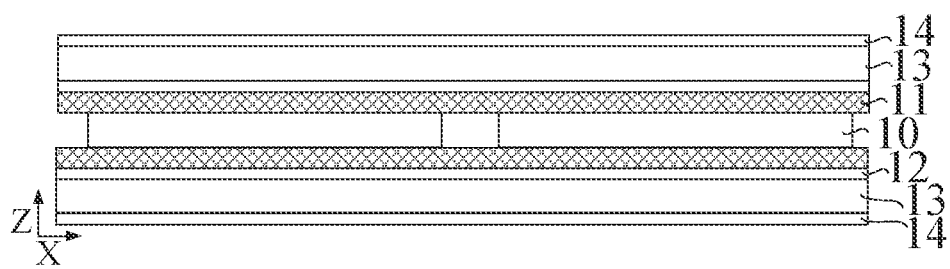
FIG. 10 is a schematic diagram illustrating a sectional structure of the section taken along $c_1$-$c_2$ in FIG. 9.
Figure 11:
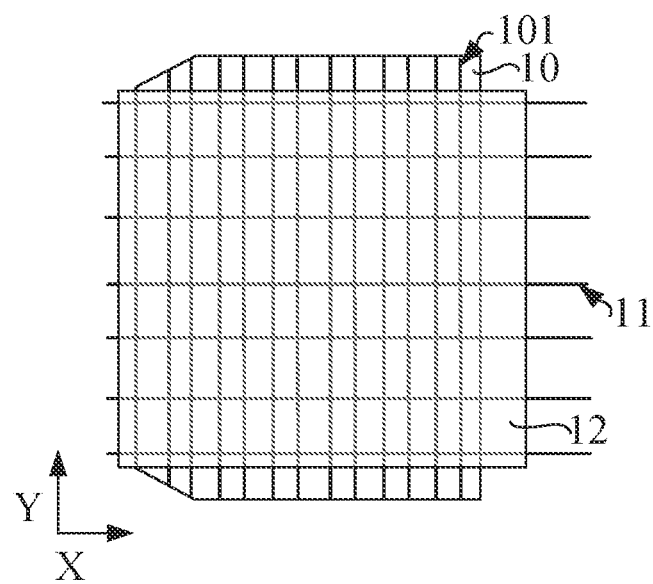
FIG. 11 is a schematic diagram illustrating a third structure of a photovoltaic module according to an embodiment of the present disclosure.
Figure 12:
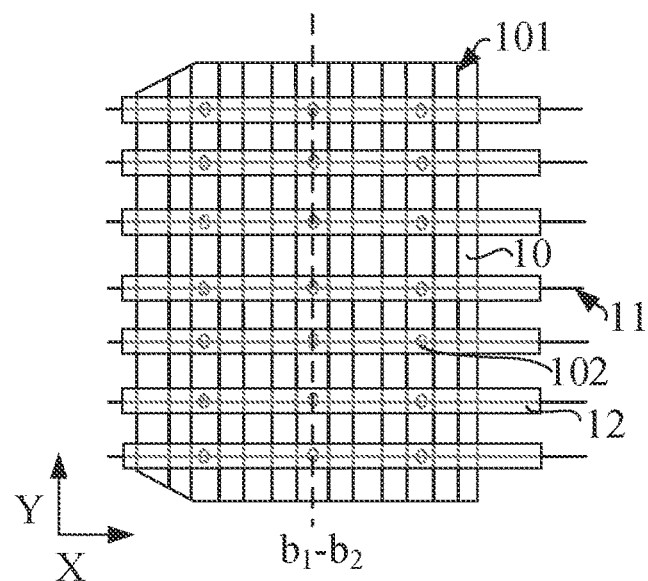
FIG. 12 is a schematic diagram illustrating a fourth structure of a photovoltaic module according to an embodiment of the present disclosure.
Figure 13:
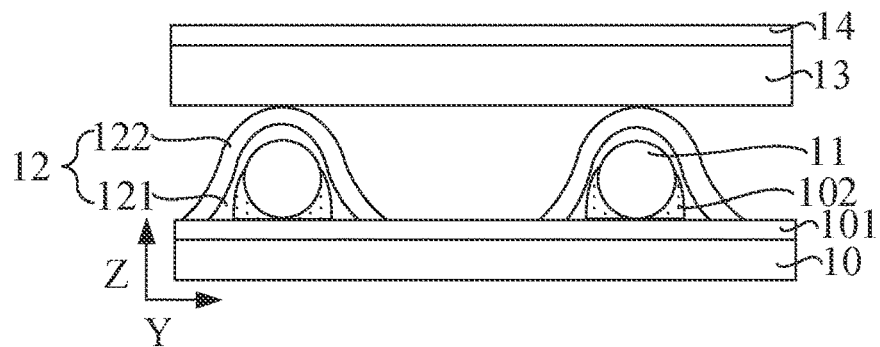
FIG. 13 is a schematic diagram illustrating a sectional structure of the section taken along $b_1$-$b_2$ in FIG. 12.

FIG. 1 is a schematic diagram illustrating a first structure of a photovoltaic module according to an embodiment of the present disclosure. FIG. 2 is a schematic diagram illustrating a sectional structure of the section taken along $c_1$-$c_2$ in FIG. 1. FIG. 3 is a schematic diagram illustrating a first sectional structure of the section taken along $a_1$-$a_2$ in FIG. 1. FIG. 4 is a schematic diagram illustrating a first structure of a composite film in a photovoltaic module according to an embodiment of the present disclosure. FIG. 5 is a schematic diagram illustrating a second sectional structure of the section taken along $a_1$-$a_2$ in FIG. 1. FIG. 6 is a schematic diagram illustrating a second structure of a composite film in a photovoltaic module according to an embodiment of the present disclosure. FIG. 7 is a schematic diagram illustrating a third sectional structure of the section taken along $a_1$-$a_2$ in FIG. 1. FIG. 8 is a schematic diagram illustrating a third structure of a composite film in a photovoltaic module according to an embodiment of the present disclosure. FIG. 9 is a schematic diagram illustrating a second structure of a photovoltaic module according to an embodiment of the present disclosure. FIG. 10 is a schematic diagram illustrating a sectional structure of the section taken along $c_1$-$c_2$ in FIG. 9. FIG. 11 is a schematic diagram illustrating a third structure of a photovoltaic module according to an embodiment of the present disclosure. FIG. 12 is a schematic diagram illustrating a fourth structure of a photovoltaic module according to an embodiment of the present disclosure. FIG. 13 is a schematic diagram illustrating a sectional structure of the section taken along $b_1$-$b_2$ in FIG. 12.

In the FIGS. 1, 9, 11 and 12, the encapsulation layer and the cover plate of the photovoltaic module are not shown, or the encapsulation layer and the cover plate are in a transparent state to show and describe a position and connection relationship between the cells and the connection components. The sectional views of FIGS. 3, 5, 7 and 13 only show various film layer structures at one side of the cells. The film layer structures at the other side of the cells may be same as or different from the film layer structures of the opposite side of the cells. It should be understood that, the photovoltaic module in FIGS. 3, 5, 7 and 13 are not laminated, that is, the encapsulation layer is not filled in a gap between the cells and alloying between the connection components and the grid structures is not achieved. After the photovoltaic module shown in the above drawings is laminated, the morphology of the composite films may change and the specific morphology is not limited herein as long as the composite films can cover the surface of the connection components.

By referring to FIGS. 1 to 13, according to some embodiments of the present disclosure, a photovoltaic module includes a plurality of cells 10, and each cell 10 includes grid structures 101 spaced apart in a first direction X. The photovoltaic module includes a plurality of connection components 11 spaced apart in a second direction Y, and the plurality of connection components 11 are located on surfaces of the plurality of cells 10 and surfaces of the grid structures 101, and each respective connection component of the plurality of connection components 11 is electrically connected to adjacent cells 10. The photovoltaic module includes a plurality of composite films 12, each covering a surface of a respective connection component of the plurality of connection components 11 and a partial surface of a corresponding cell on which the respective connection component is located, the partial surface is located at both sides of the respective connection component 11 in a direction perpendicular to the first direction. Each of the plurality of composite films 12 includes an adhesive layer 121 and a blocking layer 122, and the adhesive layer 121 is located between the blocking layer 122 and the respective connection component 11. The photovoltaic module includes an encapsulation layer 13, covering surfaces of the plurality of composite films 12, and a glass transition temperature of at least one of the adhesive layer 121 and the blocking layer 122 is greater than a glass transition temperature of the encapsulation layer 13. The photovoltaic module includes a cover plate 14, located at a side of the encapsulation layer 13 away from the plurality of cells 10.

In some embodiments, each cell 10 include, but not limited to, any one of PERC cell, Passivated Emitter and Rear Totally-diffused (PERT) cell, Tunnel Oxide Passivated Contact (TOPCon) cell and Heterojunction Technology (HIT/HJT) cell. In some embodiments, each cell 10 may be a monocrystalline silicon solar cell, a polycrystalline silicon solar cell, an amorphous silicon solar cell or a multi-compound solar cell. The multi-compound solar cell may specifically be a cadmium sulfide solar cell, a gallium arsenide solar cell, a copper indium selenium solar cell or a perovskite solar cell.

In some embodiments, each cell 10 may be Interdigitated back contact (IBC) cell which refer to a back junction and back contact solar cell structure with positive and negative metal electrodes arranged in interdigitated form on a rear surface of the cell. Its PN junctions and electrodes are located on the rear surface of the cell, that is, the electrodes in the emitter region and the base region of the IBC cell are both located on the rear surface without grids blocking on the front surface, thereby improving the photoelectric conversion performance of the cell. In the sectional diagram shown, the film layer structures at one side of the cell 10 may be different from the film layer structures at the other side of the cell 10, and the film layer structures of the cell 10 may include an encapsulation layer 13 and a cover plate 14.

Each cell 10 may be a full-size cell or a sliced cell. The sliced cell refers to a cell formed by subjecting one complete full-slice cell to cutting process. The cutting process includes: Linear Spectral Clustering (LSC) process, and thermal stress cell separation (TMC) process. In some embodiments, the sliced cell may be a half slice cell which may be understood as half-cut cell or two-slice cell. The function of the half-cut cell is to increase the generation power by reducing the resistance loss. According to Ohm's law, it can be known that the interconnection electric loss of the solar cell is positively proportional to the square of the electric current. After the cell is cut into two halves, the electric current is reduced by half and the electric loss is also reduced to one quarter of the loss of the full-size cell. The increasing number of the cells also increases the number of cell gaps. By reflection of the backplane of the module, the cell gap helps to increase the short circuit current. Furthermore, the half-cut cell module may optimize the width of the welding ribbon of the cell. Conventionally, it is required to achieve optimized balance between increasing the width of the welding ribbon to reduce the electric loss and reducing the width of the welding ribbon to reduce the loss of light blocking. The half-cut cell module reduces the cell loss and the width of the welding ribbon may be set to thinner to reduce the loss of light blocking, contributing to increase the cell efficiency and the generation power. In some embodiments, the sliced cell may be a three-slice cell, four-slice cell, or eight-slice cell or the like.

In some embodiments, the photovoltaic module includes at least two cells 10, and the at least two cells 10 are connected by the plurality of connection components 11 in series or in parallel to form a cell string. A cell gap may be presented between adjacent cells 10 to achieve electric insulation between different cells 10.

In some embodiments, the grid structures 101 are configured to collect a photo-generated current inside the solar cells and direct the current to outside the cell 10. The cells include main bus bars and auxiliary grids, and the auxiliary grids have an extending direction intersected with an extending direction of the main bus bars. The auxiliary grids are configured to collect the current of the base, and the main bus bars are configured to collect the current of the auxiliary grids and transmit the current to the welding ribbon. In some embodiments, the grid structures 101 are auxiliary grids which are also called secondary grids. The auxiliary grids are configured to direct the current. The cells 10 are in a main bus bar free design to shorten a transport path of carriers and reduce a series resistance, increase the front light-reception area and improve the module power, contributing to increase the short circuit current. Thus, the amount of the grid printing silver paste can be reduced to reduce the production costs.

In some embodiments, the grid structures 101 includes first electrodes 111 and second electrodes 112. Each cell has a first surface and a second surface opposite to the first surface. The first electrodes 111 are formed on the first surface and the second electrodes 112 are formed on the second surface. The first electrodes 111 are one type electrode of a positive electrode and a negative electrode, and the second electrodes 112 are the other type electrode of the positive electrode and the negative electrode. Each of the plurality of connection components 11 is connected to the first electrode 111 of a first cell 10 and the second electrode 112 of a second cell 10 adjacent to the first cell.

In some embodiments, as shown in FIGS. 1 and 2, the first surfaces of the cells 10 all face toward a same side and the second surfaces of the cells 10 all face toward a same side. In other words, the first electrodes 111 of all cells face toward a same side and the second electrodes 112 of all cells face toward a same side. The connection component 11 needs to naturally extend from the first surface of a first cell to a second surface of a second cell adjacent to the first cell, such that the connection component 11 is connected to the first electrode 111 of the first cell and the second electrode 112 of the second cell 10 adjacent to the first cell.

In some embodiments, as shown in FIGS. 9 and 10, the cells 10 are arranged in an order of first surface, second surface, first surface and second surface in sequence, and thus the connection components 11 are not bend. The connection component 11 is directly connected to the first electrode 111 of the first cell and the second electrode 112 of the second cell 10 adjacent to the first cell.

In some embodiments, each of the plurality of connection components 11 is a welding ribbon, which is used for interconnection between cells 10 and collects the current and then transmits the current to an element outside the photovoltaic module. The welding ribbon includes a bus ribbon and an interconnection ribbon. The bus ribbon is configured to connect the photovoltaic cell string and a junction box, and the interconnection ribbon is configured to connect the cells 10.

In some embodiments, each of the plurality of connection components 11 is in a core wrapping structure, and includes a conductive layer and a welding layer wrapped on the surface of the conductive layer. The conductive layer is the main conductive transmission layer of the connection component 11. Thus, the lower the resistivity of the conductive layer is, the smaller the electrical loss of the connection component 11 is, and the better the cell efficiency and the generation power are. The material of the conductive layer is a highly-conductive material such as copper, nickel, gold, and silver or an alloy material of low resistivity.

In some embodiments, the welding layer may be plated or coated on the surface of the conductive layer by a special process such as electroplating, vacuum deposition, spraying or hot dip coating or the like. In this process, the raw material of the welding layer is uniformly covered around the conductive layer based on an ingredient proportion and thickness. The main function of the welding layer is to allow the connection components 11 to have weldability and securely weld the connection components 11 to the grid structures 101 of the cells 10, achieving good current guide effect.

In some embodiments, the material of the welding layer is a metal material or alloy material with a melting point lower than that of the conductive layer, for example, a tin alloy. The tin alloy may include a tin-zinc alloy, a tin-bismuth alloy or a tin-indium alloy. Tin is used for welding of welding material because of its low melting point, good affinity with a metal such as copper and good welding fastness. Lead in the tin-lead alloy can reduce the melting point of the welding ribbon, and tin and lead can form an eutectic point with the melting point of 183° C. and have good welding performance and use performance. In the embodiments of the present disclosure, another metal element, for example, the bismuth element, is used to replace lead or added to the tin-lead alloy. The use of the bismuth element can reduce the melting point temperature and the surface tension. The melting point of the tin-bismuth alloy can be lowered to 139° C., satisfying the requirements of low-temperature welding.

In some embodiments, there is a welding flux in the welding layer. The welding flux refers to a chemical substance which can help and promote a welding process while achieving protection and preventing oxidation reaction during a welding procedure. The welding flux includes an inorganic welding flux, an organic welding flux and a resin welding flux. It should be understood that the welding flux has a lower melting point than the welding layer and the flowability of the welding layer in molten state can be increased to achieve good alloying between the welding layer and the grid structures 101.

In some embodiments, the cross section along the second direction Y of each of the plurality of connection components 11 is in a shape of circular. A circular ribbon has no orientation and alignment problems. The circular ribbon is easier to produce in batches. In some embodiments, the cross section of each of the plurality of connection components 11 may be triangular or any other shape, so as to increase a contact area between the welding ribbon and the grid structures and reduce the problems of the alignment offset of the connection components 11 and the grid structures 101.

In some embodiments, the surface of each of the plurality of connection components 11 away from the cells 10 has a light reflection layer which is located at an outer side surface of the welding layer away from the conductive layer and the cell 10. The light reflection layer is used to improve the electrical loss caused by a blocking area of the connection component for the cell 10. In some embodiments, the outer surface of the welding layer has light reflection grooves which are recessed grooves or channels facing toward the conductive layer from the welding layer. The sunshine is reflected by the side walls of the light reflection grooves to the cell 10, so as to increase the utilization rate of the sunshine.

In some embodiments, each of the plurality of composite films 12 refers to a film layer formed by using two or more materials based on a ratio and a morphology. Referring to FIGS. 1 and 3, there is no contact between adjacent composite films 12. Each of the plurality of composite films 12 is covered on the surface of the respective connection component 11 and the partial surface of the corresponding cell 10 at both sides of the respective connection component 11 in the direction perpendicular to the first direction. In this way, the composite films 12 fully wrap a contact interface between the connection components 11 and the grid structures 101 so as to prevent the encapsulation layer in a molten state from seeping into the contact interface between the grid structures 101 and the connection components 11 during a lamination process, thus avoiding affecting the contact performance between the connection components 11 and the grid structures 101, and hence avoiding affecting the yield of the photovoltaic module. Furthermore, there is no contact between adjacent composite films 12. On one hand, the blocking area of the non-transparent composite films 12 for the cells 10 can be reduced, so as to reduce the optical loss; on the other hand, the softness and permeability of the composite films 12 may be not better than the encapsulation layer 13, and thus the adjacent composite films 12 are not in contact so as to reduce the defects (gaps or air spacings) in the photovoltaic module as possible, so as to exhaust the air as possible. Thus, the following problem can be avoided: when the air is heated, the encapsulation layer 13 or the composite film 12 is separated from the surface of the cells 10 and thus water vapor corrodes the cells 10.

Furthermore, the above composite films 12 may also serve as a part of the encapsulation layer 13 after following the lamination processing, helping to reduce the risk of the connection components 11 penetrating through the encapsulation layer 13 because of small thickness of the adhesive film on the surface of the connection components 11. Since the composite films 12 may serve as a part of the encapsulation layer 13, the thickness of the encapsulation layer 13 can be reduced correspondingly so as to reduce the preparation costs of the encapsulation layer 13. Since the thickness of the encapsulation layer 13 is decreased, the light absorption of the encapsulation layer 13 is lowered. Thus, the cells 10 can receive more sunshine, which helps to increase the photoelectric conversion efficiency of the cells 10. Further, the composite films 12 may also be used for moisture isolation to improve the performance of the grid structures 101.

In some embodiments, a spacing between adjacent composite films 12 is less than ⅚ of a spacing between adjacent connection components 11. Hence, the composite films 12 cover a larger area of the connection components 11 but no large blocking area is brought to the surfaces of the cells 10. Therefore, the preparation costs and the blocking area of the cells 10 can be reduced.

It is worth noting that, the above spacing between adjacent composite films 12 refers to a distance between sides facing each other of adjacent composite films 12 or a distance between edges facing each other of the adjacent composite films 12. The above spacing between adjacent connection components 11 refers to a distance between edges of the connection components 11. Based on the spacing between adjacent composite films 12 being less than ⅚ of the spacing between adjacent connection components 11, it can be inferred that the composite films 12 are also located on the surface of the cells 10, and thus close protection is provided for the contact structures of the connection components 11 and the grid structures 101.

In some embodiments, as shown in FIG. 11, along the second direction Y, adjacent composite films 12 are a continuous film layer, namely, adjacent composite films 12 are in contact with each other and belong to a same original film layer. In the operation of correspondingly laying the composite films 2 in preparation of the photovoltaic module, it is possible to disregard the alignment of the composite films 12 with the connection components 11, thus reducing the preparation difficulty of the photovoltaic module to some extent.

It is worth noting that, it is guaranteed that, along the second direction Y, a side of the composite films 12 close to the edge of the cells 10 covers the surface of the connection components 11 closest to the edge of the cells 10, or, a first spacing between the edge of the composite films 12 and the opposed edge of the cells is less than a second spacing between the edge of the connection components 11 and the opposed edge of the cells, where no limitation is subjected to the specific values and ranges of a difference between the first spacing and the second spacing.

In some embodiments, each of the plurality of composite films 12 may be in a integrally-formed structure and thus, there is no offset and inter-interface defect between the adhesive layer 121 and the blocking layer 122 in the operations prior to the lamination processing, improving the entire performance of the plurality of composite films 12.

In some embodiments, along the first direction X, the plurality of composite films 12 cover the connection components 11 on a plurality of cells 10, that is, one composite film 12 is also located in the cell gap between adjacent cells 10, so as to achieve full wrapping of the composite film 12 on the connection components 11, and prevent the encapsulation layer 13 in a molten state from seeping to a part between the grid structures 101 and the connection components 11 from the edge of the cells 10.

It should be understood that, for one cell, along the first direction X, the length of the composite film 12 is greater than the length of the cell 10 and less than or equal to the length of the connection component 11, which ensures that the encapsulation layer in a molten state cannot seep to the part between the grid structure 101 and the connection component 11 from the edge of the cell 10, and the preparation costs of the composite film 12 can also be lowered.

In some embodiments, the adhesive layer 121 refers to a film layer formed of viscous material, which is configured to fix the respective connection component 11 to the corresponding cell 10, so as to prevent the respective connection component 11 from offsetting in the operations prior to the lamination processing; and prevent the offset of the respective connection component 11 caused by the encapsulation layer in a molten state pushing the respective connection component 11 during the lamination process.

In some embodiments, the material of the adhesive layer 121 may include ethylene-vinyl acetate copolymer (EVA), acrylic ester or polyethylene (PE) or the like. When the material of the adhesive layer 121 is EVA, the adhesive layer 121 having a viscosity to fix the respective connection component 11 to the corresponding cell 10, has water resistance and corrosion resistance to serve as a blocking layer for preventing the encapsulation layer 13 in a molten state from seeping to a part between the respective connection component 11 and the grid structures 101 and to serve as a protection layer for preventing water vapor. The EVA preparation cost is low and thus the preparation cost of the composite films can also be reduced.

When the material of the adhesive layer 121 is acrylic ester, since acrylic ester has a transparency, the optical loss of the cells 10 can be reduced. Acrylic ester can be directly cured at a fast speed at a low temperature, which reduces the thermal stress of the cells 10 and the risk of breakage of the cells 10, helping to increase the yield of the photovoltaic module; Acrylic ester has good water resistance and thus can prevent water vapor from damaging the connection components 11.

In some embodiments, the adhesive layer 121 has a thickness in a range of 10 μm to 150 μm. For example, the thickness of the adhesive layer 121 may be 10 μm to 130 μm, 10 μm to 109 μm, 10 μm to 85 μm, 10 μm to 139 μm, 30 μm to 150 μm, 68 μm to 150 μm, 102 μm to 150 μm or 49 μm to 124 μm. The thickness of the adhesive layer 121 may specifically be 15 μm, 29 μm, 65 μm, 89 μm, 106 μm, 134 μm or 150 μm. When the thickness of the adhesive layer 121 is in the above range, the adhesive layer 121 has sufficient thickness to fix the connection components 11 to the surface of the cells 10 and ensure no offset in subsequent operations. Further, the adhesive layer 121 cannot occupy much thickness of the photovoltaic module. Thus, the thickness of the photovoltaic module can be reduced to some extent, thus achieving high degree of integration of the photovoltaic module.

In some embodiments, the adhesive layer 121 has a glass transition temperature in a range of −55 to 0° C. The range of the glass transition temperature of the adhesive layer 121 is to ensure that the adhesive layer 121 can show a high elastic state under a normal temperature. Thus, the adhesive layer 121 can have a viscosity which enables the composite films 12 to fix the connection components 11 and prevent offset of the connection components 11, and further prevents water vapor and the encapsulation layer in a molten state from invading the contact interface between the cells 10 and the composite films 12. Furthermore, in the adhesive layer 121, some modifiers with high glass transition temperature may be added to the pure and viscous high-molecular materials such that the glass transition temperature of the adhesive layer 121 is greater than the glass transition temperature of the encapsulation layer 13. When the encapsulation layer is in a molten state, the adhesive layer 121 is not melted to present glass state, and thus the encapsulation layer in a molten state cannot invade the contact interface between the connection components 11 and the grid structures 101 through the adhesive layer 121. The range of the glass transition temperature of the adhesive layer 121 may be −58 to −1° C., −48 to −12° C., −31 to −1° C. or −38 to −15° C.

The glass transition temperature (Tg) refers to a temperature at which a glass state changes to a high elastic state (rubber state). When the temperature is low, the material is a rigid solid which is similar to glass and can deform little under the action of the external force. This state is called glass state. When the temperature continues increasing to a specific range, the material deforms much more and maintains a stable deformation in a subsequent temperature interval. This state is called high elastic state. Along with increase of the temperature, the material gradually deforms furthermore and gradually changes to a viscous fluid and at this time, the deformation cannot be restored. This state is called viscous state. The glass transition temperature can be measured by using Differential scanning calorimetry (DSC) instrument.

In some embodiments, the blocking layer 122 may refer to a film layer having isolation performance for preventing the encapsulation layer in a molten state from seeping to a part between the connection components 11 and the grid structures 101 and blocking water vapor. The material of the blocking layer 122 includes polyethylene terephthalate (PET), polyolefin (POE), liquid silicon gel, or polyvinyl butyral (PVB). POE is a non-polar material, which has excellent water vapor blocking capability and ion blocking capability, and its water vapor transmission rate is only about ⅛ of EVA adhesive film; due to stable molecular chain structure, no acidic substance can be generated by decomposition during an aging process, thus having excellent anti-aging performance. PVB has good water resistance, durability and oil resistance, and the PVB resin has excellent optical clarity, with its refractive index approximate to that of the glass. An image picked up by a laminated glass can not have optical distortion and dual phase, so the loss of the incident light contacted by the surface of photovoltaic module can be reduced. PVB can maintain non-deformable in a wide temperature range; it features excellent anti-impact performance and combination of flexibility and firmness; it has very good bonding efficiency with various glass surfaces. The liquid silicon gel has excellent tear resistance, resilience, yellowing resistance, thermal stability and heat and aging resistances and the like, and at the same time, it has a medium viscosity, and is easy to operate; and the finished product has high transparency.

In some embodiments, the thickness of the blocking layer 122 is in a range of 20 μm to 50 μm. The range of the thickness of the blocking layer 122 may be 20 μm to 45 μm, 20 μm to 38 μm, 20 μm to 31 μm, 25 μm to 50 μm, 36 μm to 50 μm, 23 μm to 48 μm, 31 μm to 42 μm or 30 μm to 40 μm. The thickness of the blocking layer 122 may specifically be 23 μm, 26 μm, 31 μm, 36 μm, 39 μm, 45 μm or 50 μm. When the thickness of the blocking layer 122 is in the above range, the blocking layer 122 has sufficient thickness to prevent water vapor and encapsulation layer in a molten state and further the blocking layer 122 cannot occupy much thickness of the photovoltaic module. Thus, the thickness of the photovoltaic module can be reduced to some extent, achieving high degree of integration. Furthermore, the light absorption of the blocking layer is small, helping to increase the photoelectric conversion efficiency of the cells.

In some embodiments, a ratio of the thickness of the adhesive layer 121 to the thickness of the blocking layer 122 is in the range of 1:5 to 75:1. The ratio of the thickness of the adhesive layer 121 to the thickness of the blocking layer 122 may be in the range of 1:5 to 50:1, 1:5 to 35:1, 1:5 to 10:1, 1:1 to 75:1, 18:1 to 75:1, 35:1 to 75:1, 25:1 to 51:1 or 39:1 to 73:1. The ratio of the thickness of the adhesive layer 121 to the thickness of the blocking layer 122 may specifically be 13:10, 51:5, 99:5, 28:1, 37:1, 52:1, 58:1, 135:2 or 75:1. When the ratio of the thickness of the adhesive layer 121 to the thickness of the blocking layer 122 is in the above range, the adhesive layer 121 has a larger thickness while the blocking layer 122 has a smaller thickness. A softness of the adhesive layer 121 is greater than a softness of the blocking layer 122 and the adhesive layer 121 is disposed in larger proportion, and therefore, the composite films 12 are more easily attached to the connection components 11 and the gap between the composite films 12 and the connection components 11 is smaller. The larger thickness of the blocking layer 122 can achieve better isolation effect and thus water vapor or the like can be prevented from invading the cells 10. The softness refers to a flexibility of a film layer or an attachment degree between the film layer and the connection component.

In some embodiments, under a same preset temperature, the viscosity of the adhesive layer 121 is greater than the viscosity of the blocking layer 122. Hence, the adhesive layer has sufficient viscosity to fix the connection component 11 to the cell 10, such that a gap formed between the composite film 12 and the cell 10 may have compactness to some extent to prevent invasion of the encapsulation layer 13.

In some embodiments, the viscosity value of the adhesive layer before lamination and curing is in a range of 8000 to 20000 mPa·s. In the above range of viscosity, the adhesive layer 121 before curing has a flowability and a poor compactness to expel the air and prevent the air heated later from pushing away the adhesive layer 121, resulting in that the adhesive film in a molten state flows to a part between the connection components and the grid structures. The viscosity of the adhesive layer laminated and cured may be increased to 10000-30000 mPa·s, such that there is sufficient adhesion force between the connection components 11 and the cells and protection is provided for the connection components 11. Thus, seepage of the encapsulation layer 13 during lamination and water vapor corrosion during a long time of use of the module can be prevented.

In some embodiments, the blocking layer 122 may be different in material from the adhesive layer 121. The water transmission rate of the material of the blocking layer 122 is in a range of 2~4 g/m², and specifically in a range of 2 to 3.3 g/m², 2 to 2.8 g/m², 2 to 2.64 g/m², 2.35 to 3.89 g/m², 2.8 to 3.96 g/m² or 2.6 to 3.35 g/m². The water transmission rate of the blocking layer 122 may specifically be 2.05 g/m², 2.45 g/m², 2.98 g/m², 3.17 g/m², 3.56 g/m² or 4 g/m². In the above range, the blocking layer 122 has good blocking performance. The blocking performance refers to water vapor blocking performance which means a blocking effect of a packaging material for a permeate such as liquid or water vapor or the like. In a case of good blocking performance, the encapsulation layer in a molten state cannot penetrate through the blocking layer 122, namely, the seeping micro-molecules of the encapsulation layer and water vapor cannot penetrate through the blocking layer, and thus protection can be achieved for the connection components 11.

The water transmission rate (water vapor transmission rate) includes a water vapor transmission amount and a water vapor transmission coefficient. The water vapor transmission amount represents a weight of the water vapor transmitting though a material in a specific time under a specific temperature and a specific humidity. The water vapor transmission coefficient represents an amount of the water vapor transmitting though a unit area of sample with a unit thickness in a unit time in a relative humid environment under a specific temperature, and specific unit water vapor pressure difference.

In some embodiments, the glass transition temperature of the blocking layer 122 is in a range of 100 to 200° C., and specifically, in a range of 130 to 200° C., 153 to 200° C., 189 to 200° C. or 150 to 184° C. The range of the glass transition temperature of the blocking layer 122 is configured to ensure that the glass transition temperature of the blocking layer 122 is greater than the glass transition temperature of the encapsulation layer 13. When the encapsulation layer is in a molten state, the blocking layer 122 is not melted and presents a glass state. Therefore, the encapsulation layer in a molten state cannot invade a part between the connection components 11 and the grid structures 101 through the blocking layer 122.

In some embodiments, a plasticizer may be added to the blocking layer 122 to increase the blocking performance of the blocking layer 122. In an embodiment of the present disclosure, some viscous micro-molecules may be added to the blocking layer 122 to increase a connection effect between the blocking layer 122 and the cells, preventing offset of the connection components and invasion of the encapsulation layer. In an embodiment of the present disclosure, some micro-molecules with high glass transition temperature may be added to the blocking layer 122 to further increase the glass transition temperature of the blocking layer 122.

In some embodiments, by referring to FIGS. 5 and 6, the blocking layer 122 surrounds a part of the adhesive layer 121, and thus the blocking layer 122 wraps the adhesive layer 122. At the contact interface between the cell 10 and the composite film 12, the blocking layer 122 with a higher percentage is used to prevent invasion of the encapsulation layer 13 in a molten state and invasion of water vapor.

In some embodiments, by referring to FIGS. 7 and 8, the adhesive layer 121 surrounds a part of the blocking layer 122 and the blocking layer 122 is not in contact with the cell 10. Thus, there is more contact area between the adhesive layer 121 and the cell 10, the bonding effect between the composite film 12 and the cell 10 is better and the possibility of offset of the connection component 11 relative to the cell 10 is lower. Furthermore, the adhesive layer 121 has a poorer compactness than the blocking layer 122, and the air located between the adhesive layer 121, the cell 10 and the connection component 11 can be expelled through the adhesive layer 121. In this way, in a subsequent lamination process or any thermal treatment process, the air in the space wrapped by the composite film 12 is prevented from pushing away the composite film 12 or separation of the composite film 12 and the cell 10 can be prevented.

It is worth noting that, in the wrapping structure formed in the morphology of the composite films 12 of the photovoltaic module as shown in FIG. 6, the width of the blocking layer 122 at the side surface of the adhesive layer 121 should be set based on actual situations, but it should be guaranteed that there is a contact interface between the adhesive layer 121 and the cell 10 and the proportion of the contact interface is not too small, so as to exert the effect of the adhesive layer 121.

In some embodiments, a side of the composite films 12 away from the cells 10 is provided with light reflection layers or light reflection grooves to increase the sunshine utilization rate and improve the photoelectric conversion efficiency of the cells.

In some embodiments, as shown in FIGS. 12 and 13, the photovoltaic module further includes adhesive points 102, which are located on the surfaces of the cells 10 and each adhesive point is located between adjacent grid structures 101; the connection components 11 are located on the adhesive points 102.

In some embodiments, a glue material for preparing the adhesive points 102 is preferably a transparent glue, so as to ensure, if possible, a light absorbing area of the surface of the cells and avoid affecting the efficiency of the solar cells due to decrease of the light absorption area of the surface of the cells 10 caused by disposal of the adhesive points 102.

In some embodiments, for one connection component 11, there may be 2 to 20 adhesive points 102, with a spacing of adjacent adhesive points 102 being 5 mm to 100 mm. With the setting of the number and the spacing of the adhesive points 102, on one hand, good fixing effect between the connection component 11 and the cell 10 can be achieved such that the connection component 11 cannot be offset before the lamination process and in the lamination process; on the other hand, the number of the adhesive points 102 can diminish the optical loss of the cells 10, so as to obtain more electrochemical performance.

It should be understood that, the cells 10 in the above photovoltaic module are cells subjected to main-bus-bar-free designing, that is, no main bus bars are disposed on the surfaces of the cells but direct alloying between the connection components 11 and the finger electrodes is achieved to realize current collection of the surfaces of the cells. In the photovoltaic module provided by the embodiments of the present disclosure, the solution of the composite films is also applicable to the conventional cells with main bus bars to improve the contact performance between the main bus bars and the connection components and thus improve the yield of the photovoltaic modules.

In some embodiments, the encapsulation layer 13 includes a first encapsulation layer and a second encapsulation layer. The first encapsulation layer is covered on one of the front and rear surfaces of the cells 10, and the second encapsulation layer is covered on the other of the front and rear surfaces of the cells 10. Specifically, at least one of the first encapsulation layer and the second encapsulation layer may be an organic encapsulation adhesive film such as an Ethylene Vinyl Acetate Copolymer (EVA) adhesive film, a Polyolefin elastomer (POE) adhesive film or a polyvinyl butyral (PVB) adhesive film or the like.

In some embodiments, a melting point of the encapsulation layer 13 is less than a lamination temperature during lamination process. The encapsulation layer 13 is a film layer obtained by presenting the adhesive film in a molten state at the temperature of the laminator and then in the presence of an initiator in the encapsulation layer 13, causing the micro-molecules in the adhesive film to be mutually combined into macro-molecules in a crossed state.

In some embodiments, a melting point of the encapsulation layer 13 and a melting point of the connection components 11 may be set based on actual requirements. When the melting point of the encapsulation layer 13 is greater than the melting point of the connection components 11, alloying can be achieved for the connection components 11 before the encapsulation layer 13 is presented as molten state, and hence, the invasion of the adhesive layer in a molten state into the gap between the grid structures 101 and the connection components 11 and the offset of the connection components 11 caused by push can be effectively avoided. When the melting point of the encapsulation layer 13 is less than the melting point of the connection components 11, a lower lamination temperature can be set to improve the thermal stress subjected to the cells and increase the yield of the photovoltaic modules.

In some embodiments, the glass transition temperature of at least one of the adhesive layer 121 and the blocking layer 122 is greater than the glass transition temperature of the encapsulation layer. When the encapsulation layer 13 is in a molten state, one of the adhesive layer 121 and the blocking layer 122 still maintains good morphology. Therefore, the invasion of the encapsulation layer in the molten state into the part between the grid structures 101 and the connection components 11 and the offset of the connection components 11 caused by the encapsulation layer pushing the connection components can be effectively avoided.

In some embodiments, the glass transition temperature of the encapsulation layer is in a range of −70 to −10° C. The glass transition temperature of the encapsulation layer is configured to ensure that the encapsulation layer is presented as molten state to fill gaps in the photovoltaic module in a lamination process so as to increase the yield of the photovoltaic modules.

In some embodiments, the cover plate 14 may be a cover plate having light transmission function, for example, a glass cover plate, or a plastic cover plate or the like. Specifically, a surface of the cover plate 14 facing toward the encapsulation layer 13 may be an uneven surface to increase the utilization rate of the incident light. The cover plate 14 includes a first cover plate and a second cover plate. The first cover plate is located on the first encapsulation layer and the second cover plate is located on the second encapsulation layer.

In the photovoltaic module provided by the embodiments of the present disclosure, on one hand, one composite film 12 is disposed between the connection components 11 and the encapsulation layer 13 and the composite films 12 cover the surfaces of the connection components 11. The composite films 12 include the adhesive layer 121 and the blocking layer 122, where the adhesive layer 121 is configured to fix a relative position between the connection components 11 and the cells 10 to prevent the offset of the connection components 11 due to push of the encapsulation layer 13 in a molten state; and the blocking layer 122 is configured to prevent the encapsulation layer 13 in a molten state from flowing to the part between the connection components 11 and the cells 11 in a lamination process, and further avoid electrical connection problem between the cells 10 and the connection components 11. Therefore, the module weldability can be improved, the pull force in the welding ribbon can be increased, the welding quality of the modules can be enhanced, the problem of pseudo soldering or the like of the modules can be reduced, the product quality of the modules can be improved, and the reworking rate or the like of the module preparation process can be diminished. Thus, the module productivity is significantly improved. On the other hand, the glass transition temperature of at least one of the adhesive layer 121 and the blocking layer 122 is greater than the glass transition temperature of the encapsulation layer 13, and in a lamination process, the encapsulation layer 131 is presented as molten state and one of the adhesive layer 121 and the blocking layer 122 is presented as close solid state. Thus, the encapsulation layer in the molten state is prevented from flowing to the part between the grid structures 101 and the connection components 11. Furthermore, the adhesive layer 121 and the blocking layer 122 may serve as a part of the encapsulation layer 13 to, on one hand, prevent the risk of the connection components 11 penetrating through the encapsulation layer 13 because of relatively small thickness of the encapsulation layer 13 on the surface of the connection components. The composite films 12 may also isolate moisture to improve the performance of the grid structures.

Correspondingly, according to some embodiments of the present disclosure, another aspect of the embodiments of the present disclosure further provides a preparation method of a photovoltaic module, for preparing the photovoltaic module provided in the above-described embodiments, and therefore, those elements same as or similar to the above embodiments will not be described herein.

In some embodiments, the preparation method of the photovoltaic module includes the following operations.

At S1, a plurality of cells are provided, where each cell includes grid structures spaced apart in a first direction.

At S2, a plurality of connection components spaced apart in a second direction are provided, where the plurality of connection components are located on surfaces of the cells and each electrically connected to adjacent cells respectively.

At S3, a plurality of composite films are provided, where each of the plurality of composite films cover a surface of a respective connection component of the plurality of connection components, and a partial surface of a corresponding cell on which the respective connection component is located and the partial surface is located at both sides of the respective connection component in a direction perpendicular to the first direction. Each of the plurality of composite films includes an adhesive layer and a blocking layer, and the adhesive layer is located between the blocking layer and the respective connection component.

At S4, an encapsulation layer is provided, where the encapsulation layer covers surfaces of the plurality of composite films; and a glass transition temperature of at least one of the adhesive layer and the blocking layer is greater than a glass transition temperature of the encapsulation layer.

At S5, a cover plate is provided, where the cover plate is located at a side of the encapsulation layer away from the plurality of cells.

At S6, lamination processing is performed.

In some embodiments, the plurality of composite films are prepared by: uniformly mixing raw materials of the adhesive layer according to a ratio, and extruding the mixture into a first raw material by an extrusion equipment; uniformly mixing raw materials of the blocking layer according to a ratio and extruding the mixture into a second raw material by the extrusion equipment; pouring one of the first raw material and the second raw material into a molding equipment based on a ratio to form an initial thin film; performing co-extrusion and lamination to pour the other of the first raw material and the second raw material into the molding equipment and form the composite films by screw extrusion and lamination.

In some embodiments, the initial thin film is formed by the second raw material, and after the preparation process of the initial thin film, the method further includes: performing extrusion and grooving on the initial thin film by using a mould to form an accommodation groove in the middle of the initial thin film; in the coextrusion and lamination, the first raw material in a semifluid state is placed into the accommodation groove of the initial thin film in a semifluid state and laminated by the screw extrusion and then extruded by the forming mould and then cast in the form of sheets to a roller surface of a stably-running cooling roller; the film sheets are cooled and molded on the cooling roller and then subjected to drawing and edge cutting and then rolled up.

In some embodiments, the following operations are also performed between operations S1 and S2: adhesive points are laid on the surfaces of the cells and between adjacent grid structures; the connection components are located on the adhesive points. After the connection components are laid, curing is also performed for the adhesive points to increase the viscosity of the adhesive points so as to promote a curing capability between the connection components and the cells. For example, before curing, the viscosity of the adhesive points is 8000 mPa·s and after curing, is 10000 mPa·s.

As mentioned above, in the technology of the photovoltaic module, the main bus bars of the cells are usually welded to the welding ribbon while the positive and negative electrodes of two adjacent cells are connected by the welding ribbon to form a cell string, and then cell strings are arranged for circuit connection, and then the cell strings are encapsulated by an encapsulation material to form a photovoltaic module.

The welding between the main bus bars and the welding ribbon is usually performed by forming a high temperature region by arranging a number of infrared lamp tubes. The tin-lead alloy on the surface of welding ribbon is melted under high temperature and the welding ribbon is fused with a silver paste of the main bus bars on the surface of the cells. However, in high temperature welding process, a typical welding temperature is in a range of 220 to 350° C., easily leading to hidden cracks or breakage or the like caused by stressed warping of the cells. Furthermore, due to influence of a diameter and a yield strength of the welding ribbon, there is a large stress between the cells in a conventional welding method. Under the outdoor weather conditions such as windy or snowy conditions, the photovoltaic module may tend to have hidden cracks, resulting in decreased power output and reliability of the photovoltaic module.

In order to avoid use of the infrared welding method, a metal with a low melting point may be used to prepare a welding ribbon and then the welding ribbon is fixed to the surface of the cells by a fixing film. In a lamination process of the photovoltaic module, the welding ribbon with low welding point is combined with the grid structures by use of a temperature and a pressure of a laminator. However, since the fixing film covers the welding ribbon and the surfaces of the cells at both sides of the welding ribbon, an included angle between the fixing film and the surface of the cells may be formed. A bonding gap may be enclosed by the included angle and the side surface of the welding ribbon, and the air in the bonding gaps may be heated to expand during lamination process and hence separate the fixing film, and further, the molten adhesive film may flow to a gap between the welding ribbon and the surface of the cells, leading to insulation between the welding ribbon and the grid structures. As a result, it is required to expel the air in the bonding gaps. For example, a plurality of air vents may be disposed at a position of the fixing films corresponding to the bonding gap, such that the air in the bonding gaps is expelled through the air vents to a side of the fixing films away from the surface of the cells. Meanwhile, in order to prevent the molten adhesive film from invading the bonding gap, leading insulation between the welding ribbon and the grid structures, the air vents may be configured as a special structure to reduce the possibility that the molten adhesive film invades the bonding gap, so as to improve the yield of the photovoltaic modules.

According to some embodiments of the present disclosure, a photovoltaic module is provided so as to improve the yield of the photovoltaic module.

Figure 14:
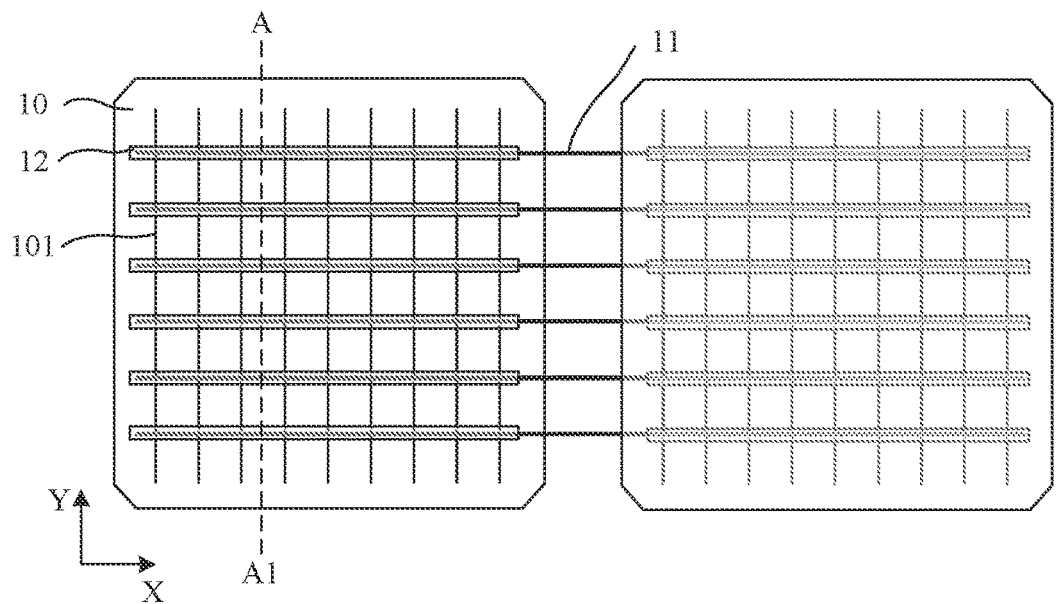
FIG. 14 is a structural schematic diagram illustrating another photovoltaic module according to an embodiment of the present disclosure.
Figure 15:
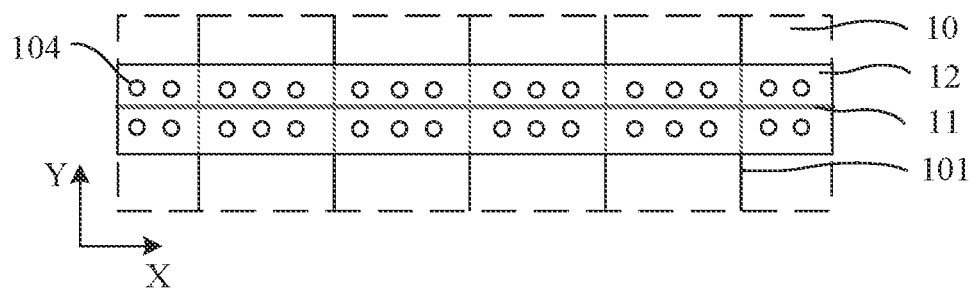
FIG. 15 is a schematic diagram of a partially-enlarged structure of a fixing film in FIG. 14.
Figure 16:
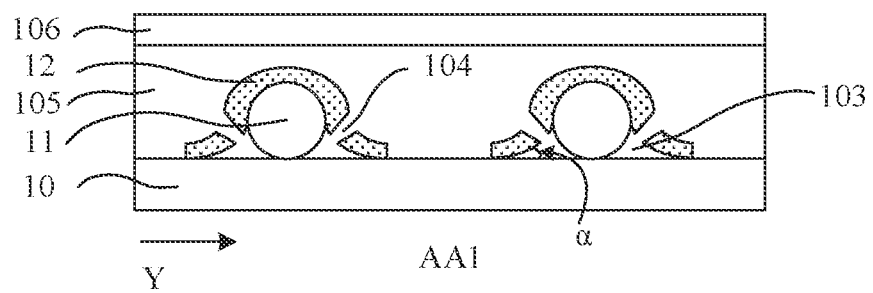
FIG. 16 is a schematic diagram illustrating a first sectional structure taken along AA1 in FIG. 14.
Figure 17:
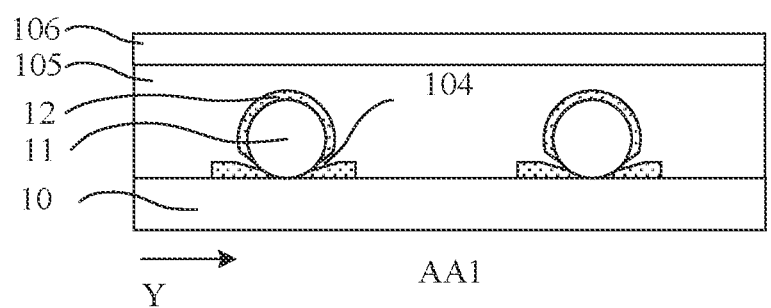
FIG. 17 is a schematic diagram illustrating a second sectional structure taken along AA1 in FIG. 14.
Figure 18:
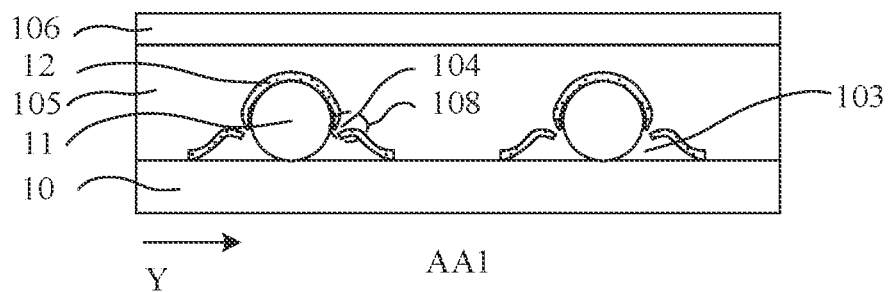
FIG. 18 is a schematic diagram illustrating a third sectional structure taken along AA1 in FIG. 14.
Figure 19:
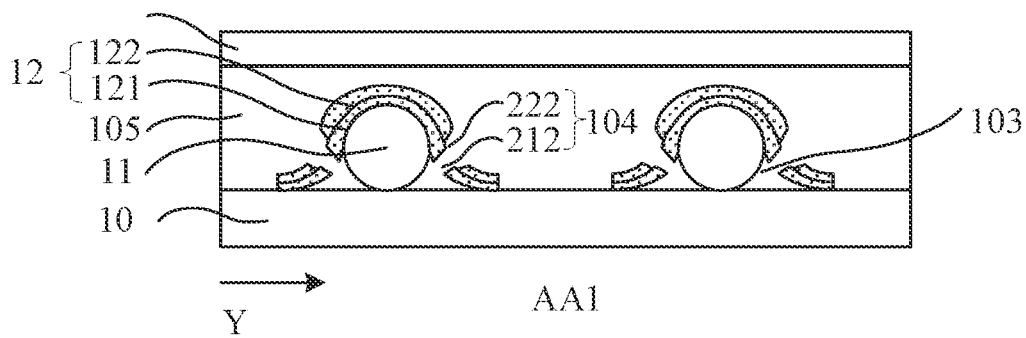
FIG. 19 is a schematic diagram illustrating a fourth sectional structure taken along AA1 in FIG. 14.

FIG. 14 is a structural schematic diagram illustrating a photovoltaic module according to an embodiment of the present disclosure. FIG. 15 is a schematic diagram of a partially-enlarged structure of a fixing film in FIG. 14. FIG. 16 is a schematic diagram illustrating a first sectional structure taken along AA1 in FIG. 14. FIG. 17 is a schematic diagram illustrating a second sectional structure taken along AA1 in FIG. 14. FIG. 18 is a schematic diagram illustrating a third sectional structure taken along AA1 in FIG. 14. FIG. 19 is a schematic diagram illustrating a fourth sectional structure taken along AA1 in FIG. 14. The photovoltaic module provided by the embodiment is described in details below in combination with drawings.

By referring FIGS. 14 to 17, the photovoltaic module includes: a plurality of cells 10, arranged in a first direction X; a plurality of connection components 11 extending along the first direction X, where the plurality of connection components 11 are located on surfaces of the plurality of cells 10, and adjacent cells 10 are electrically connected through a respective connection component 11; a plurality of fixing films 12, each covering a surface of respective connection component 11 and further covering the surface of the plurality of cells 10 at both sides of the respective connection component in a direction perpendicular to the first direction X. As shown in FIG. 16, an included angle α is formed between each of the plurality of fixing films 12 on at least one side of the respective connection component 11 and the surface of a corresponding cell 10 on which the respective connection component is located, a bonding gap 103 is enclosed by the included angle α and a side surface of the respective connection component 11, a plurality of air vents 104 are disposed at a position of each of the plurality of fixing films 12 corresponding to the bonding gap 103, and an orthographic projection of the plurality of air vents 104 on the surface of the corresponding cell 10 is not overlapped with an orthographic projection of the respective connection component 11 on the surface of the corresponding cell 10; an encapsulation layer 105, covered on the surfaces of the plurality of fixing films 12 and also covered on the surfaces of the plurality of cells 10 exposed from the plurality of fixing films 12; a cover plate 106, covered on a surface of the encapsulation layer 105 away from the plurality of cells 10.

In the photovoltaic module provided by the embodiments of the present disclosure, a plurality of cells 10 are electrically connected via the connection components 11. On any cell 10, each connection component 11 corresponds to a respective fixing film 12, and the fixing film 12 covers the surface of the connection component 11 and a partial surface of the cell 10 at both sides of the connection component 11 in the direction perpendicular to the first direction X, such that the connection component 11 are fixed on the surface of the cell 10. Furthermore, the fixing films 12 may serve as an isolation layer between the connection components 11 and the encapsulation layer 105. During a encapsulation process, the fixing films 12 can prevent the encapsulation layer 105 in a molten state from flowing to the gap between the connection components 11 and the surface of the cells 10, and further prevent the molten encapsulation layer 105 from causing insulation between the connection components 11 and the grid structures on the cells 10. There is an included angle α between the fixing film 12 on at least one side of the connection component 11 and the surface of the cell 10, a bonding gap 103 is enclosed by the included angle α and a side surface of the connection component 11, and a plurality of air vents 104 are disposed at a position of the fixing film 12 corresponding to the bonding gap 103. In this way, during a subsequent lamination process, the air in the bonding gap 103 can be expelled through the air vents to the side of the fixing films 12 away from the surfaces of the cells 10 and it is avoided that the air in the bonding gaps 103 is heated to expand to separate the fixing films 12, so as to improve the stability of the fixing films and increase the yield of the photovoltaic module.

It should be understood that, with reference to FIG. 15, the air vents 104 corresponding to the bonding gap 103 on the fixing film 12 may be disposed to avoid the position of grid structures 101. Thus, invasion of a small amount of molten encapsulation layer 105 into the bonding gap 103 through the air vents 104 to lead to insulation between the connection components 11 and the grid structures 101 can be avoided. As shown in FIG. 15, descriptions are made with three air vents disposed between adjacent grid structures 101 and the numbers of the air vents at both sides of the connection component 11 being equal, which does not constitute any limitation to the number of the air vents between adjacent grid structures 101. In other embodiments, the numbers of the air vents between adjacent grid structures may be 1, 4, 8 or 10; in other embodiments, the numbers of the air vents at both sides of the connection components may also be unequal. Furthermore, as shown in FIG. 15, the air vents at both sides of the connection component 11 are disposed symmetrically relative to the connection component 11, which does not constitute any limitation to the arrangement of the air vents at both sides of the connection component 11; in other embodiments, the air vents at both sides of the connection component may be asymmetrically disposed in the direction perpendicular to the first direction.

It is worth noting that, FIG. 16 shows a state of a photovoltaic module not laminated and FIG. 17 shows a state of a photovoltaic module laminated. By referring to FIGS. 16 and 17, when the photovoltaic module undergoes a lamination process, the air in the bonding gaps 103 may be expelled by squeeze of the encapsulation layer 105 through the air vents 104 to a side of the fixing films 12 away from the surface of the cells 10. After the lamination process, the air in the bonding gaps 103 is drained and the bonding gaps 103 disappear and hence, the fixing films 12 are attached to the side surface of the connection components 11 and the surface of the cells 10 as well as to the boundary between the connection components 11 and the surface of the cells 10.

For the cell 10, the cell 10 may be any one of a PERC cell, a Passivated Emitter and Rear Totally-diffused (PERT) cell, a Tunnel Oxide Passivated Contact (TOPCon) cell, and a Heterojunction Technology (HIT/HJT) cell. In some embodiments, the cell 10 may be a monocrystalline silicon solar cell, a polycrystalline silicon solar cell, an amorphous silicon solar cell or a multi-compound solar cell. The multi-compound solar cell may specifically be a cadmium sulfide solar cell, a gallium arsenide solar cell, a copper indium selenium solar cell or a perovskite solar cell.

It is worth noting that, for ease of descriptions, FIG. 14 shows only two adjacent cells 10 connected through the connection components 11, which does not constitute any limitation to the number of the arranged cells 10. In some embodiments, the number of the cells may be 4, 6, 8, or 15 or the like. Furthermore, in FIG. 14, descriptions are made with first electrodes on the front surface of the cell and second electrodes on the rear surface of the cell, where the first electrodes are one type of the positive and negative electrodes and the second electrodes are the other type of the positive and negative electrode. The adjacent cells are disposed with the front surfaces facing up, and the first electrode of a first cell is electrically connected to the second electrode of a second cell adjacent to the first cell through the connection components, which does not constitute any limitation to the arrangement of the adjacent cells. In some embodiments, a plurality of cells may be arranged in the first direction with the front surfaces and the rear surfaces alternately facing up and thus the connection components may be always located at a same side surface of the cells.

In some embodiments, the cell 10 may be Interdigitated back contact (IBC) cell which refer to a back junction and back contact solar cell structure with positive and negative metal electrodes arranged in interdigitated form on a back-light surface of the cell, in which PN junctions and electrodes are located on the rear surface of the cell, that is, the emitter region and the base region of the IBC cell are both located on the rear surface without grids blocking on the front surface, thereby improving the photoelectric conversion performance of the cell. That is to say, the cell 10 has first electrodes and second electrodes on the rear surface, where the first electrodes are one of the positive and negative electrodes and the second electrodes are the other of the positive and negative electrodes. The first electrodes on one of adjacent cells are electrically connected to the second electrodes on the other of the adjacent cells through the connection components.

In some embodiments, two adjacent cells 10 may be electrically connected in series or in parallel through the connection components 11 to form a cell string. A cell gap is presented between adjacent cells 10 to realize electrical insulation between different cells 10.

In some embodiments, the cell 10 has grid structures on the surface. The grid structures are configured to collect a photo-generated current in the solar cell and direct the current to outside the cell. The grid structures include main bus bars and auxiliary grids, where the extending direction of the auxiliary grids intersect with the extending direction of the main bus bars. The auxiliary grids are configured to collect the current of the base, and the main grids are configured to collect the current of the auxiliary grids and transmit the current to the connection components.

It is worth noting that, as shown in FIGS. 14 to 17, the cell 10 is only provided with auxiliary grids 101 on the surface, that is, the cell 10 is designed as no main bus bar. After the connection components 11 are fixed on the surfaces of the cells 10 through the fixing films 12, alloying may be directly performed on the connection components 11 and the auxiliary grids 101 by lamination process. As a result, the auxiliary grids 101 on the adjacent cells 10 can be electrically connected via the connection components 11, helping to save the laying of the main bus bars 101 and lower the manufacturing costs of the cells 10. Furthermore, the main bus bar free design can shorten the carrier transport path and reduce the series resistance, and further increase the light reception area of the front surface and improve the module power.

It is worth noting that, in FIGS. 14 to 15, descriptions are made with the auxiliary grids 101 extending along the second direction Y which is perpendicular to the first direction X, which does not constitute any limitation to the included angle between the first direction X and the second direction Y; in other embodiments, the included angle between the first direction and the second direction may be 30°, 45° or 60°.

In some embodiments, the cells may include main bus bars and auxiliary grids on the surface, and the connection components are located at a side of the main bus bars away from the surfaces of the cells and in electrical contact with the main bus bars, so as to electrically connect the main bus bars of the adjacent cells by the connection components. In the embodiments, no limitation is subjected to the arrangement manner of the grid structures on the surface of the cells.

For the connection components 11, the connection components 11 include welding ribbons, which are configured for interconnection between cells 10 and collect the current and then transmit the current to an element outside the photovoltaic module. In some embodiments, the welding ribbons include bus ribbons and interconnection ribbons. The bus ribbons are configured to connect the photovoltaic cell string and a junction box, and the interconnection ribbons are configured to connect adjacent cells 10.

In some embodiments, each of the connection components 11 may be formed by a conductive layer and a welding layer wrapping around the surface of the conductive layer. The material of the conductive layer may include a conductive material with good conductivity, such as copper, nickel, gold, silver and the like, or an alloy material with low resistivity; the material of the welding layer may include a material with low melting point, such as a tin-zinc alloy, a tin-bismuth alloy, or a tin-indium alloy and the like. When the conductive layer has a resistivity less than $1\times10^{-7}$ Ω·m or has an electrical conductivity greater than or equal to $1\times10^{7}$ S/m, the electrical loss of the conductive layer is small, helping to increase the cell efficiency and the generation power. The material of the welding layer is the material with low melting point, helping to satisfy the requirements of low-temperature welding of the connection components.

In some embodiments, there is a welding flux in the welding layer. The welding flux refers to a chemical substance which can help and promote a welding process while achieving protection and preventing oxidation reaction during a welding procedure. Since the melting point of the welding flux is lower than the melting point of the welding layer, the welding flux is beneficial to increasing flowability of the welding layer in a molten state so as to achieve better alloying for the connection components and the grid structures. In some embodiments, the welding flux includes an inorganic welding flux, an organic welding flux and a resin welding flux.

It is worth noting that, as shown in FIG. 16, in a plane perpendicular to the first direction X, the cross section of the connection components 11 is circular, which does not constitute any limitation to the shape of the cross section of the connection components 11. In other embodiments, in the plane perpendicular to the first direction X, the cross section of the connection components 11 may alternatively be rectangular, elliptical or polygonal.

For the fixing films 12, the fixing films 12 are configured to fix the connection components 11 on the surfaces of the cells 10, and a bonding gap 103 may be formed among the surface of the cell 10, the fixing film 12 and the side surface of the connection component 11. A plurality of air vents are disposed at a position of the fixing film 12 corresponding to the bonding gap 103. In some embodiments, the size of the air vents 104 in a direction of the fixing film 12 pointing to the bonding gap 103 gradually decreases. In a subsequent lamination process, the air in the bonding gap 103 may be heated to expand to separate the fixing film 12, and further the molten encapsulation layer 105 may easily flow to a part between the connection components 11 and the surface of the cells 10, leading to insulation between the connection components 11 and the grid structures. Therefore, a plurality of air vents 104 are disposed at a position of the fixing film 12 corresponding to the bonding gap 103, such that, in the subsequent lamination process, the air in the bonding gap 103 is expelled by squeeze of the encapsulation layer 105 through the air vents 104 to a side of the fixing films 12 away from the surface of the cells 10. Since the size of the air vents 104 along a direction of the fixing films 12 pointing to the bonding gaps 103 gradually decreases, even if the encapsulation layer after being melted in a lamination process, has a flowability, the encapsulation layer still cannot enter the bonding gap 103 through the air vents 104. As a result, the invasion of the encapsulation layer 105 into the bonding gap 103 through the air vents 104 can be avoided so as to prevent insulation and circuit break between the connection components 11 and the grid structures.

In some embodiments, with continuous reference to FIG. 16, along the direction of the fixing film 12 pointing to the bonding gap 103, the air vents 104 are shaped like funnel. The use of the funnel-shaped air vents 104 helps to expel the air from the bonding gap 103 to a side of the fixing film 12 away from the bonding gap 103 and at the same time, prevent the molten encapsulation layer 105 from entering the bonding gap 103 through the air vents 104.

FIG. 18 shows a state of a photovoltaic module not laminated. In some embodiments, with reference to FIG. 18, along the direction of the fixing film 12 pointing to the bonding gap 103, the fixing films 12 have cone-shaped protrusions 108 which have a hole at an end close to the bonding gap 103 and thus the protrusions 108 can be used as air vents 104. The formation of the cone-shaped protrusions on the fixing films helps to form a pressure difference between a side surface of the fixing film 12 away from the cell 10 and a side surface of the fixing film 12 close to the cell 10 due to squeeze of the molten encapsulation layer 105 along the direction of the fixing film 12 pointing to the bonding gap 103, and further helps to expel the air in the bonding gap 103 from the air vents 104 to a side of the fixing film 12 away from the bonging gap 103.

In some embodiments, the fixing film 12 may be a single-layer structure or a multi-layer structure. For example, in some embodiments, the fixing film 12 may be a double-layer structure. FIG. 19 shows a state of a photovoltaic module not laminated. With reference to FIG. 19, the fixing film 12 may include a first fixing film 121, which covers surfaces of the connection components 11 and surfaces of the cells 10 at both sides of the connection components 11 along a direction perpendicular to the first direction X; and a second fixing film 122, which covers a surface of the first fixing film 121.

For the first fixing film 121, the material of the first fixing film 121 includes substance having a viscosity, such as Ethylene Vinyl Acetate Copolymer (EVA), acrylic acid, Polyethylene (PE) or the like, and is configured to increase the fixing effect of the connection components and avoid the offset of the connection components during a lamination process.

For the second fixing film 122, the material of the second fixing film 122 may be Polyethylene glycol terephthalate (PET) or the like. Since the material forming the encapsulation layer has a flowability, the encapsulation layer may during a lamination process, invade to the part between the connection components and the surface of the cells, leading to insulation and circuit break between the connection components and the grid structures. The second fixing film may be used as isolation protection layer between the connection components and the encapsulation layer.

In some embodiments, with continuous reference to FIG. 19, first holes 212 are disposed at the position of the first fixing films 121 corresponding to the bonding gaps 103, and second holes 222 are disposed at the position of the second fixing films 122 corresponding to the bonding gaps 103. The first holes 212 and the second holes 222 are jointly formed into the air vents 104. The size of the first holes 212 is less than the size of the second holes 222. In a lamination process, since the air in the bonding gaps 103 has low requirements for the size of the first holes 212, even if the first holes 212 are small, the air still can be expelled from the first holes 212 to a side of the fixing films 12 away from the cells 10; in contrast, since the molten encapsulation layer 105 has a high viscosity, it is more difficult for the molten encapsulation layer 105 to invade the first holes 212 than to invade the second holes 222. The molten encapsulation layer 105 can apply pressure onto the bonding gaps 103 along the direction of the fixing films 12 pointing to the bonding gaps 103 but cannot invade the bonding gaps 103 through the first holes 212. Therefore, the molten encapsulation layer 105 forms a pressure difference at the position of the fixing films 12 corresponding to the bonding gaps 103, such that the gas in the bonding gaps 103 can be expelled from the air vents 104 while the encapsulation layer 105 cannot enter the bonding gaps 103. Thus, the air in the bonding gaps 103 can be drained and the fixing films 12 can be attached to the surface of the connection components 11 and the surface of the cells 10 as well as to the boundary of the cells 10 and the connection components 11.

In some embodiments, along the direction of the fixing films 12 pointing to the bonding gaps 103, the first holes 212 and the second holes 222 are both shaped like funnel. The size of the first holes 212 is less than the size of the second holes 222. When the molten encapsulation layer 105 forms a pressure difference at the position of the fixing films 12 corresponding to the bonding gaps 103 in a lamination process, since the first holes 212 and the second holes 222 are both shaped like funnel, the pressure difference can be transitioned uniformly and therefore the breakage of the second holes 222 due to squeeze of the molten encapsulation layer 105, when the size difference of the first holes 212 and the second holes 222 is too large, is avoided. Otherwise, when the second holes 222 are broken, the molten encapsulation layer 105 may invade into the bonding gaps 103 and flow into the part between the connection components 11 and the surface of the cells 10, leading to insulation between the connection components 11 and the grid structures.

In some embodiments, the fixing film may be a 3-layer, 5-layer or 10-layer structure where multiple sub-fixing films stacked are formed into the fixing film and a hole is disposed at a position of each sub-fixing film corresponding to the bonding gap, and the holes on the multiple sub-fixing films are jointly formed into the air vent. Along the direction of the fixing film pointing to the bonding gap, the size of the holes on the multiple sub-fixing films gradually decreases such that the size of the air vents along the direction of the fixing film pointing to the bonding gap also gradually decreases. In a lamination process, along the direction of the fixing film pointing to the bonding gap, the encapsulation layer can form a gradually-changing pressure difference at the air vents, helping to expel the air in the bonding gaps through the air vents to a side of the fixing films away from the bonding gaps and also prevent the encapsulation layer from invading into the bonding gaps through the air vents.

In some embodiments, on a surface of a side of the fixing film 12 away from the cell 10, the area of the air vent 104 is a first area; on a surface of a side of the fixing film 12 close to the cell 10, the area of the air vent 104 is a second area, where a ratio of the first area to the second area is in a range of 2 to 20. It should be understood that, the larger the ratio of the first area to the second area is, the larger the change of the size of the air vent along the direction of the fixing film 12 pointing to the bonding gap 103 is, and correspondingly, in a lamination process, the larger the pressure difference applied to the air vents 104 by the molten encapsulation layer 105 is, and thus, the side of the air vents 104 close to the cell 10 is more easily broken by the molten encapsulation layer 105 such that the molten encapsulation layer 105 can invade into the bonding gap 103. The smaller the ratio of the first area to the second area is, the smaller the change of the size of the air vents along the direction of the fixing film 12 pointing to the bonding gap 103 is, and correspondingly, in a lamination process, the smaller the pressure difference applied to the air vents 104 by the molten encapsulation layer 105 is, and thus, the side of the air vents 104 away from the cell 10 can be easily blocked by the molten encapsulation layer 105, which is unfavorable for expelling the air in the bonding gap 103 to a side of the fixing film 12 away from the bonding gap 103. Therefore, the ratio of the first area to the second area may be adjusted properly according to the size of the bonding gaps 103 to help expel the air in the bonding gaps 103 to a side of the fixing films 12 away from the bonding gaps 103 and also prevent deformation of the air vents 104 caused by the pressure difference applied by the molten encapsulation layer 105.

In some embodiments, the second area may be in a range of 3 $\mu m^2$ to 700 $\mu m^2$, and specifically may be 3 $\mu m^2$, 30 $\mu m^2$, 80 $\mu m^2$, 100 $\mu m^2$, 200 $\mu m^2$, 500 $\mu m^2$ or 700 $\mu m^2$. It should be understood that the second area is the size of the side of the air vents 104 close to the cells 10, and the larger the second area is, the more quickly the air in the corresponding bonding gaps 103 can be expelled. However, the excess size may lead the molten encapsulation layer 105 to invade into the bonding gaps 103. Furthermore, too small second area is unfavorable for expelling the air in the bonding gaps 103 to a side of the fixing films 12 away from the bonding gaps 103. Therefore, the size of the second area may be adjusted in a proper range, to help expel the air in the bonding gaps 103 and also prevent the molten encapsulation layer 105 from entering the bonding gaps 103 through the air vents 104.

In some embodiments, in the first direction, a distance between the air vents is in a range of 1 mm to 10 mm, and specifically may be 1 mm, 1.2 mm, 2.2 mm, 3.3 mm, 4.4 mm, 5.5 mm, 6.6 mm, 7.7 mm, 8.8 mm or 10 mm. It should be understood that, the connection components and the fixing films both extend along the first direction and the corresponding bonding gaps also extend along the first direction; along the first direction, the smaller the distance between the air vents is, the more quickly the air in the bonding gaps can be expelled. However, too small distance may lead to deformation of the fixing films between the air vents due to squeeze of the molten encapsulation layer, and further lead to deformation of the air vents, and thus lead to invasion of the encapsulation layer into the bonding gaps. Hence, the distance between the air vents needs to be selected in a range to increase the rate of expelling the air in the bonding gaps and at the same time avoid deformation of the fixing films and the air vents due to too short distance between the air vents.

In some embodiments, in a direction perpendicular to the surface of the cell 10, a height from the air vents 104 to the surface of the cell 10 is greater than ½ of a height of the connection components 11. In other words, along the direction perpendicular to the surface of the cell 10, the air vents 104 are located at an upper half part of the connection components 11 and in a lamination process, the fixing films 12 can be gradually attached to the side surface of the connection components 11 and the included angle between the air vents 104 and the surface of the cell 10 is smaller and smaller. Correspondingly, the difficulty for the molten encapsulation layer 105 to invade into the bonding gaps 103 is increased, helping to prevent the molten encapsulation layer 105 from invading into the bonding gaps 103 through the air vents 104.

In some embodiments, the encapsulation layers 105 include a first encapsulation layer and a second encapsulation layer, where the first encapsulation layer covers one of the front surface or the rear surface of the cells and the second encapsulation layer covers the other of the front surface or the rear surface of the cells. Specifically, at least one of the first encapsulation layer and the second encapsulation layer may be an organic encapsulation adhesive film such as an Ethylene Vinyl Acetate Copolymer (EVA) adhesive film, a Polyolefin elastomer (POE) adhesive film or a polyvinyl butyral (PVB) adhesive film or the like.

In some embodiments, the cover plates 106 may be cover plates having light transmission function, for example, glass cover plates, or plastic cover plates or the like. In some embodiments, a surface of the cover plate facing toward the encapsulation layer may be an uneven surface to increase the utilization rate of the incident light. In some embodiments, the cover plates include a first cover plate and a second cover plate, where the first cover plate is opposed to the first encapsulation layer and the second cover plate is opposed to the second encapsulation layer.

In the photovoltaic module provided by the embodiments of the present disclosure, a plurality of cells 10 are electrically connected via the connection components 11. On any cell 10, each connection component 11 corresponds to one fixing film 12, and the fixing film 12 covers the surface of the connection component 11 and a partial surface of the cell 10 at both sides of the connection component 11 along a direction perpendicular to the first direction X, such that the connection component 11 is fixed on the surface of the cell 10. Furthermore, the fixing film 12 may serve as an isolation layer between the connection component 11 and the encapsulation layer 105. During a lamination process, the fixing film 12 can prevent the encapsulation layer 105 in a molten state from flowing to a part between the connection component 11 and the surface of the cell 10, and further prevent the molten encapsulation layer 105 from causing insulation between the connection component 11 and the grid structures on the cell 10. There is an included angle α between the fixing film 12 on at least one side of the connection component 11 and the surface of the cell 10, a bonding gap 103 is enclosed by the included angle α and a side surface of the connection component 11, and a plurality of air vents 104 are disposed at a position of the fixing film 12 corresponding to the bonding gap 103. In this way, during a subsequent lamination process, the air in the bonding gap 103 can be expelled through the air vents to the side of the fixing film 12 away from the surface of the cell 10 and it is avoided that the air in the bonding gap 103 is heated to expand to separate the fixing film 12, so as to improve the stability of the fixing film and increase the yield of the photovoltaic module.

According to some embodiments of the present disclosure, another embodiment of the present disclosure provides a preparation method of a photovoltaic module, which is used for laminating the above photovoltaic module to prepare an encapsulated photovoltaic module, so as to improve the yield of the photovoltaic module. It is worth noting that those parts same as or corresponding to the above embodiments can be referred to the relevant descriptions of the above embodiments and will not be repeated herein.

Figure 20:
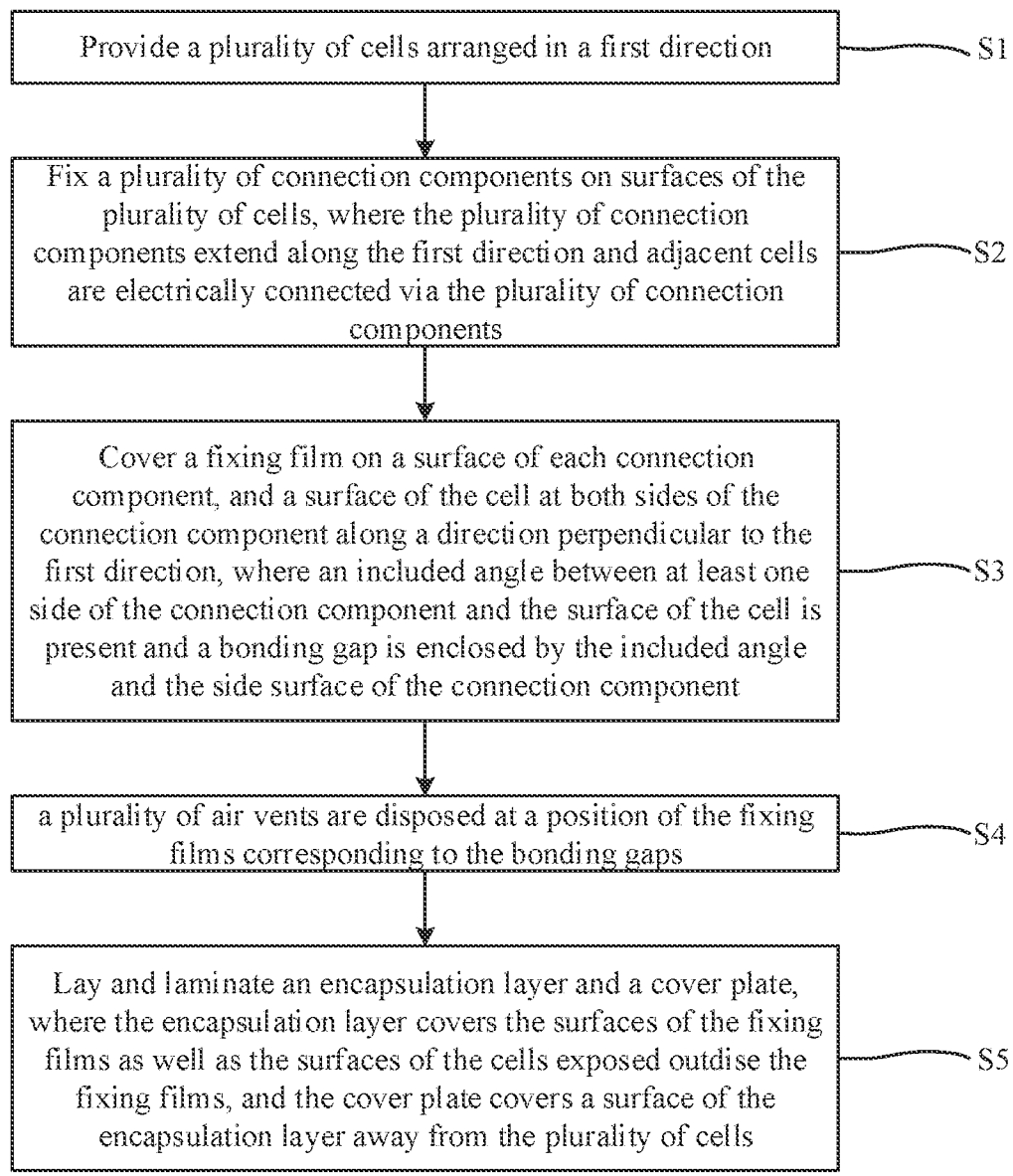
FIG. 20 is a flowchart illustrating a preparation method of another photovoltaic module according to an embodiment of the present disclosure.

FIG. 20 is a flowchart illustrating a preparation method of another photovoltaic module according to an embodiment of the present disclosure. The preparation method provided by the embodiments of the present disclosure will be elaborated below in combination with the drawings.

By referring to FIG. 20, the preparation method of the photovoltaic module may include the following operations.

At S1, a plurality of cells are provided, where the plurality of cells are arranged in a first direction.

At S2, a plurality of connection components are fixed on surfaces of the plurality of cells, where the plurality of connection components extend along the first direction and adjacent cells are electrically connected via the connection components.

At S3, a fixing film is covered on a surface of each connection component, and the fixing film further cover surfaces of the cells at both sides of the connection component along a direction perpendicular to the first direction, where an included angle between at least one side of the connection component and the surface of the cell is present and a bonding gap is enclosed by the included angle and the side surface of the connection component.

At S4, a plurality of air vents are disposed at a position of the fixing film corresponding to the bonding gap.

At S5, an encapsulation layer and a cover plate are laid and laminated, where the encapsulation layer covers the surfaces of the fixing films as well as the surfaces of the cells exposed outside the fixing films, and the cover plate covers a surface of the encapsulation layer away from the cells.

In the preparation method of the photovoltaic module provided by the embodiments of the present disclosure, a plurality of cells are electrically connected via the connection components. On any cell, each connection component corresponds to one fixing film, and the fixing film covers the surface of the connection component and a partial surface of the cell at both sides of the connection component along the direction perpendicular to the first direction X, such that the connection components are fixed on the surfaces of the cells. Furthermore, the fixing films may serve as isolation layers between the connection components and the encapsulation layer. During a lamination process, the fixing films can prevent the encapsulation layer in a molten state from flowing to the part between the connection components and the surfaces of the cells, and further prevent the molten encapsulation layer from causing insulation between the connection components and the grid structures on the cells. There is an included angle α between the fixing film on at least one side of the connection components and the surface of the cells, the bonding gaps 103 is enclosed by the included angle α and a side surface of the connection component, and a plurality of air vents are disposed at a position of the fixing films corresponding to the bonding gaps. In this way, during a subsequent lamination process, the air in the bonding gaps can be expelled through the air vents to the side of the fixing films away from the surfaces of the cells and it is avoided that the air in the bonding gaps is heated to expand to separate the fixing films, so as to improve the stability of the fixing films and increase the yield of the photovoltaic module.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

Persons of skills in the art may understand that the above embodiments are only specific embodiments of the present disclosure. In practical applications, various changes may be made in form and details without departing from the spirit and scope of the present disclosure. Persons skilled in the art may make various changes and modifications without departing from the scope of protection of the present disclosure. Thus, the scope of protection of the present disclosure shall be indicated by the appended claims.

What is claimed is:

1. A photovoltaic module, comprising:
   a plurality of cells, each of the plurality of cells including grid structures spaced apart in a first direction;
   a plurality of connection components extending along the first direction and spaced apart in a second direction; wherein each of the plurality of connection components is electrically connected to corresponding adjacent cells of the plurality of cells;
   a plurality of composite films, each of the plurality of composite films covering a surface of a respective connection component of the plurality of connection components and portions of a surface of a corresponding cell on opposite sides of the respective connection component;
   wherein each of the plurality of composite films includes a first layer and a second layer, and the first layer is located between the second layer and the respective connection component;
   an encapsulation layer, covering surfaces of the plurality of composite films; and
   a cover plate, disposed on a side of the encapsulation layer away from the plurality of cells;
   wherein each of the plurality of composite films includes a first portion and a second portion, the first portion covering the surface of the respective connection component, and the second portion and surfaces of the respective connection component and the corresponding cell that correspond to the second portion enclosing a bonding gap;
   each of the plurality of composite films is provided with a plurality of through holes at a position corresponding to the bonding gap, and an orthographic projection of the plurality of through holes on the surface of the corresponding cell does not overlap with an orthographic projection of the respective connection component on the surface of the corresponding cell.

2. The photovoltaic module of claim 1, wherein the first layer is an adhesive layer, the second layer is a blocking layer, and at least one of the adhesive layer and the blocking layer has a glass transition temperature greater than a glass transition temperature of the encapsulation layer.

3. The photovoltaic module of claim 2, wherein a first spacing between adjacent composite films is less than ⅚ of a second spacing between adjacent connection components;
   the first spacing refers to a distance between edges facing each other of the adjacent composite films;
   the second spacing refers to a distance between edges of the adjacent connection components.

4. The photovoltaic module of claim 2, wherein a ratio of a thickness of the adhesive layer to a thickness of the blocking layer is in a range of 1:5 to 75:1.

5. The photovoltaic module of claim 2, wherein the blocking layer surrounds a part of the adhesive layer.

6. The photovoltaic module of claim 2, wherein along the second direction, adjacent composite films are a continuous film layer.

7. The photovoltaic module of claim 2, wherein under a same preset temperature, the adhesive layer has a viscosity greater than a viscosity of the blocking layer.

8. The photovoltaic module of claim 2, wherein the blocking layer is different in material from the adhesive layer, and the blocking layer has material of a water transmission rate in a range of 2 to 4 $g/m^2$.

9. The photovoltaic module of claim 2, wherein the material of the blocking layer includes PET, POE, liquid silica gel or PVB.

10. The photovoltaic module of claim 2, further comprising: adhesive points located on the surfaces of the plurality of cells;
    wherein each of the adhesive points is located between adjacent grid structures;
    wherein the plurality of connection components are located on the adhesive points.

11. The photovoltaic module of claim 2, wherein the glass transition temperature of the adhesive layer is in a range of −55 to 0° C.

12. The photovoltaic module of claim 2, wherein the glass transition temperature of the blocking layer is in a range of 100 to 200° C.

13. The photovoltaic module of claim 1, wherein the first layer is provided with a first hole at a position corresponding to the bonding gap, and the second layer is provided with a second hole at a position corresponding to the bonding gap;
the first hole and the second hole are jointly formed into a respective through hole of the plurality of through holes, and a size of the first hole is less than a size of the second hole.

14. The photovoltaic module of claim 1, wherein a respective through hole of the plurality of through holes has a first area on a first surface of a fixing film on which the respective through hole is located away from the corresponding cell, and a second area on a second surface of the fixing film close to the corresponding cell, and a ratio of the first area to the second area is in a range of 2:1 to 20:1.

15. The photovoltaic module of claim 14, wherein the second area is in a range of 3 $\mu m^2$ to 700 $\mu m^2$.

16. The photovoltaic module of claim 1, wherein a distance of adjacent through holes along the first direction of the plurality of through holes is in a range of 1 mm to 10 mm.

17. The photovoltaic module of claim 4, wherein the blocking layer surrounds a part of the adhesive layer.

18. The photovoltaic module of claim 8, wherein the material of the blocking layer includes PET, POE, liquid silica gel or PVB.

19. The photovoltaic module of claim 11, wherein the glass transition temperature of the blocking layer is in a range of 100 to 200° C.

* * * * *